(12) United States Patent
Nagase et al.

(10) Patent No.: US 6,641,980 B2
(45) Date of Patent: Nov. 4, 2003

(54) DEVELOPER FOR PHOTOPOLYMERIZABLE PRESENSITIZED PLATE FOR USE IN MAKING LITHOGRAPHIC PRINTING PLATE AND METHOD FOR PREPARING LITHOGRAPHIC PRINTING PLATE

(75) Inventors: Hiroyuki Nagase, Shizuoka-Ken (JP); Kazuto Kunita, Shizuoka-Ken (JP)

(73) Assignee: Fuji Photo Film Co., Ltd., Minami-Ashigara (JP)

( * ) Notice: Subject to any disclaimer, the term of this patent is extended or adjusted under 35 U.S.C. 154(b) by 0 days.

(21) Appl. No.: 10/187,605

(22) Filed: Jul. 3, 2002

(65) Prior Publication Data

US 2003/0118951 A1 Jun. 26, 2003

(30) Foreign Application Priority Data

Jul. 4, 2001 (JP) ........................ 2001-203609

(51) Int. Cl.$^7$ ................................ G03F 7/30
(52) U.S. Cl. ..................................... 430/302
(58) Field of Search ........................ 430/302

(56) References Cited

U.S. PATENT DOCUMENTS

| | | | |
|---|---|---|---|
| 3,615,480 A | 10/1971 | Lam | |
| 3,782,951 A | 1/1974 | Lee | |
| 4,374,920 A | 2/1983 | Wanat et al. | |
| 4,576,903 A | 3/1986 | Baron et al. | |
| 5,773,194 A | * 6/1998 | Hattori et al. | ............ 430/284.1 |

FOREIGN PATENT DOCUMENTS

| EP | 0 466 071 A2 | 1/1992 |
|---|---|---|
| EP | 0 732 628 A1 | 9/1996 |
| EP | 0 949 540 A1 | 10/1999 |
| EP | 1 035 435 A2 | 9/2000 |
| EP | 1 048 982 A1 | 11/2000 |
| EP | 1 070 990 A1 | 1/2001 |
| JP | 01 223447 A | 9/1989 |
| JP | 02 007055 A | 1/1990 |
| JP | 03 038647 A | 2/1991 |
| JP | 06 230582 A | 8/1994 |
| JP | 2000 0066415 A | 3/2000 |

* cited by examiner

Primary Examiner—Hoa Van Le
(74) Attorney, Agent, or Firm—Burns, Doane, Swecker & Mathis, LLP

(57) ABSTRACT

A developer for a photopolymerizable presensitized plate for use in making a lithographic printing plate characterized in that it comprises an alkali silicate and a nonionic compound represented by the following general formula (I), it has a molar ratio: $SiO_2/M_2O$ (wherein M represents an alkali metal or an ammonium group) ranging from 0.75 to 4.0, a pH value ranging from 11.5 to 12.8 and a conductivity ranging from 3 to 30 mS/cm:

$$A\text{—}W \qquad (I)$$

wherein A represents a hydrophobic organic group whose logP as determined for A—H is not less than 1.5 and W represents a nonionic hydrophilic organic group whose logP as determined for W—H is less than 1.0; a method for preparing a lithographic printing plate comprising the steps of imagewise exposing, to light, a presensitized plate for use in making a lithographic printing plate, which comprises a substrate provided thereon with a photopolymerizable light-sensitive layer containing a compound having at least one addition-polymerizable ethylenically unsaturated double bond and a photopolymerization initiator; and then developing the exposed presensitized plate using the above developer. The developers and the method for making a lithographic printing plate according to the present invention can prevent scumming during printing and simultaneously attain sufficient printing durability without impairment of image-forming performance, and the developer can dissolve or disperse stably for a long period of time the compounds which are not soluble in the developer, and therefore the running performance of the developer can be excellent and stabilized.

16 Claims, 4 Drawing Sheets

A : Light-Sensitive Layer Less Susceptible to Developer-Penetration
B : Light-Sensitive Layer Susceptible to Developer-Penetration
$t_A$ : Time Elapsed Till the Electrostatic Capacity Undergoes a Change
$t_B$ : Time Elapsed Till the Electrostatic Capacity Undergoes a Change In Case of the Invention time → (There is observed interference waves.)

In Case of the Conventional Technique time → (There is not observed any interference waves.)

DEVELOPER FOR PHOTOPOLYMERIZABLE PRESENSITIZED PLATE FOR USE IN MAKING LITHOGRAPHIC PRINTING PLATE AND METHOD FOR PREPARING LITHOGRAPHIC PRINTING PLATE

FIELD OF THE INVENTION

The present invention relates to a novel developer for a presensitized plate for use in making a lithographic printing plate (hereinafter possibly referred to as "PS plate") and a method for preparing a lithographic printing plate. More specifically, the present invention relates to a developer optimum for developing a photopolymerizable presensitized plate for use in making a lithographic printing plate (hereinafter possibly referred to as "photopolymerizable PS plate"), which never shows any reduction of developing characteristics due to the elapse of a long period of time and repeated use, can ensure a good ability to develop the non-image area (non-exposed area) of the lithographic printing plate, does not damage the image area (exposed area) of the plate due to the development, ensures the formation of firm images and allows the achievement of high printing durability as well as a method for preparing a lithographic printing plate.

BACKGROUND OF THE INVENTION

The developers widely used conventionally for developing a photopolymerizable PS plate may roughly be divided into the following three groups: a) non-aqueous developers mainly comprising organic solvents; b) aqueous developers mainly comprising inorganic alkalis; and c) aqueous developers mainly comprising organic bases.

Among these, those presently used include, for instance, aqueous developers b) and c) at the request of the environmental protection.

Characteristic properties of these two developers will be detailed below. The inorganic alkaline developer b) is characterized in that it usually comprises a silicate and has a pH value in the proximity to 12 in order to hydrophilize the surface of a substrate of the printing plate after the development.

This silicate component is essential for the subsequent hydrophilization treatment or for preventing the non-image area from being contaminated by ink during printing, i.e., for the prevention of scumming.

For instance, there have been known a developer having a pH value of not less than 12 such as those disclosed in Japanese Un-Examined Patent Publication (hereunder referred to as "J.P. KOKAI") No. Hei 8-248643 and a developer having a pH value of not more than 12 such as those disclosed in J.P. KOKAI No. Hei 11-65129. However, the former or the developer having a pH value of not less than 12 is liable to dissolve aluminum currently used as a substrate for the printing plate and, in particular, in case of a dot (small dot) occupying a small image area, it may dissolve the aluminum substrate immediately below the image area due to the so-called side etching phenomenon and this results in a phenomenon in which small dots are removed from the substrate (skipping of small dots) during printing. In other words, this developer suffers from such a problem that it may significantly deteriorate the printing durability of the resulting printing plate.

Moreover, the latter or the developer having a pH value of not more than 12 is excellent in the foregoing printing durability and an ability of preventing any contamination of printed matter, but it is liable to cause reduction of the pH value when continuing the developing treatment over a long period of time due to, for instance, the effect of carbon dioxide present in the air and the developer causes separation of a silicate during the development and this in turn leads to the occurrence of such a novel problem that it never allows any stable development.

In addition to the foregoing, J.P. KOKAI Nos. Sho 61-109052, 2000-81711 and Hei 11-65126 and West German Patent No. 1,984,605 disclose developers free of any silicate, but all of them were not only inferior in the prevention of any contamination of printed matter to those comprising silicates, but also could simultaneously satisfy the requirements for the printing durability and the prevention of any contamination of printed matter, only with great difficulty.

On the other hand, there have been known, as the organic base-containing developer c), for instance, those each comprising an organic amine such as ethanolamine and an alcoholic organic solvent such as benzyl alcohol as an auxiliary developer. In this case, however, such a developer undoubtedly has a low pH value on the order of 10 and therefore, it is not susceptible to the influence of carbon dioxide and is excellent in the processing stability. However, it also suffers from problems in that it is not only disadvantageous in the hydrophilization of the substrate, but also has an extremely high ability of penetration into the image area, that it adversely affects, in particular, small dots and that it is accompanied by the deterioration of the image-forming ability or such a phenomenon that small dots are removed from the substrate during development.

In other words, under the existing circumstances, there is not proposed any developer suitably used for developing the photopolymerizable PS plate, while taking into consideration, for instance, the image-forming ability, prevention of any scumming and printing durability as well as the processing stability.

Regarding the composition of the developer, it has been known that factors such as the presence of a silicate, the level of pH and the presence of an inorganic or organic alkali may exert a great influence on the developing phenomenon, but any combination thereof conventionally proposed has never permitted the solution of the foregoing problems at all.

Moreover, in case of the photopolymerizable PS plate, when continuing the developing treatment over a long period of time, insolubles are accumulated, agglomerated and settled down in the developer to thus form developing sludge and this may make the development treatment unstable.

Components constituting such developing sludge have not yet been clearly elucidated. As a result of the analysis thereof, however, most of them are found to be components included in a light-sensitive layer of a PS plate and insoluble in the developer.

As such developer-insoluble components, there may be listed, for instance, a variety of coloring agents added to the light-sensitive layer for distinguishing the exposed area from the non-exposed area. These coloring agents used in the photopolymerizable PS plate are so-called pigments, which are dispersed in the light-sensitive layer in the form of aggregates in which they maintain their crystalline conditions rather than in a molecularly dispersed state, for the purpose of inhibiting any desensitization due to the capture of radicals or unnecessary interaction (such as energy transfer or electron migration) with an initiator system (for instance, an initiator alone or a combination of a sensitizing dye and an initiator). However, such a pigment is essentially insoluble in a developer. Therefore, it is only temporarily dispersed in the developer in the initial stage of the developing step for removing the non-exposed area, but when continuing the developing treatment over a long period of time, it is accumulated, agglomerated and settled down in the developer to thus form developing sludge.

On the other hand, a variety of photopolymerization initiators (radical generators) have been incorporated into the photopolymerizable PS plate for coping with the recently progressed laser light sources and among them, titanocene type initiators have been known as initiators, which are excellent in stability and sensitivity and which are light-sensitive in the wavelength ranges of laser light sources. However, this titanocene type initiator is an organic metal and thus insoluble in the developer like the foregoing pigments as coloring agents. Therefore, it is temporarily dispersed in the developer, but when continuing the developing treatment over a long period of time, it is also accumulated, agglomerated and settled down in the developer to thus form developing sludge.

Regarding the processing stability, it is quite critical to solve not only the foregoing problem of the silicate-separation associated with the reduction of pH, but also the problem of the developing sludge-formation.

In other words, there has been desired for the development of a developer for a photopolymerizable PS plate, which can satisfy the requirements for the foregoing image-forming ability, for both the prevention of contamination of printed matter and the printing durability and for the processing stability.

OBJECTS OF THE INVENTION

Accordingly, it is an object of the present invention to provide a developer for a PS plate, which can satisfy both the requirements for the prevention of scumming and the printing durability without impairing the image-forming ability, which can dissolve the foregoing developer- insoluble compounds or disperse and stabilize the same over a long period of time and which can improve the processing stability as well as a method for preparing a lithographic printing plate.

SUMMARY OF THE INVENTION

The inventors of this invention have conducted various studies and have succeeded in the achievement of the foregoing object of the invention on the basis of the following construction.

More specifically, the present invention relates to (1) a developer for a photopolymerizable presensitized plate for use in making a lithographic printing plate characterized in that it comprises an alkali silicate and a nonionic compound represented by the following general formula (I), it has a molar ratio: $SiO_2/M_2O$ (wherein M represents an alkali metal or an ammonium group) ranging from 0.75 to 4.0, and a pH value ranging from 11.5 to 12.8:

$$A\text{—}W \quad (I)$$

(In the formula, A represents a hydrophobic organic group whose logP as determined for A—H is not less than 1.5 and W represents a nonionic hydrophilic organic group whose logP as determined for W—H is less than 1.0).

According to a preferred embodiment of the present invention, the foregoing developer has a content of an alkali silicate ranging from 0.1 to 3% by weight as expressed in terms of the amount of silicon dioxide ($SiO_2$). According to another preferred embodiment of the present invention, the foregoing developer has a content of nonionic compound ranging from 0.1 to 15% by weight. Preferably, the nonionic compound represented by the foregoing general formula (I) usable herein is at least one member selected from the group consisting of nonionic aromatic ether type surfactants represented by the following general formula (I-A) and nonionic aromatic ether type surfactants represented by the following general formula (I-B).

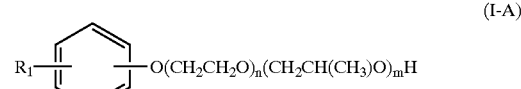

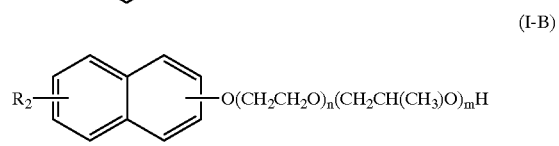

(Wherein $R_1$ and $R_2$ each represents H or an alkyl group having 1 to 100 carbon atoms and n and m each represents an integer ranging from 0 to 100, provided that n and m are not simultaneously zero).

According to a preferred embodiment of the present invention, the developer further comprises a chelating agent. According to a further preferred embodiment of the present invention, the developer may comprise carbonic acid or a carbonate.

According to another aspect of the present invention, there is also provided (2) a method for preparing a lithographic printing plate comprising the steps of imagewise exposing, to light, a presensitized plate for use in making a light-sensitive lithographic printing plate, which comprises a substrate provided thereon with a photopolymerizable light-sensitive layer containing a compound having at least one addition-polymerizable ethylenically unsaturated double bond and a photopolymerization initiator; and then developing the exposed presensitized plate using the foregoing developer.

In a preferred embodiment of the method for preparing a lithographic printing plate according to the present invention, the light-sensitive layer has an acid value of not more than 1.0 meq/g and more specifically, the light-sensitive layer comprises a compound having an acid group whose pKa value is not more than 9 and the light-sensitive layer has an acid value ranging from 0.20 to 0.60 meq/g.

In another preferred embodiment of the plate-making method according to the present invention, the imagewise exposed presensitized plate is developed in such a manner that the rate of the development of the non-exposed area is not less than 0.05 μm/s and the rate of the developer penetrating into the exposed area is not more than 0.1 μm/s.

In a further preferred embodiment of the plate-making method according to the present invention, the light-sensitive layer comprises a titanocene type initiator or a coloring agent (or a pigment). As a still further preferred embodiment of the plate-making method according to the present invention, the substrate of the presensitized plate is an anodized aluminum substrate provided thereon with an organic compound carrying a phosphorus atom-containing acidic group or an organic silicone compound.

As has been described above, the present invention has succeeded in the development of a developer, through the use of specific components, which can simultaneously satisfy both the requirements for the prevention of contamination of printed matter and the printing durability of the printing plate without impairing the image-forming ability of the PS plate for the printing plate, which can dissolve the foregoing developer-insoluble compounds or disperse and stabilize the same over a long period of time and which can improve the processing stability.

The developer containing specific components has presently been considered to be a developer composition, which satisfies the following requirements.

First of all, the developer composition should exert a very good effect on the image-forming properties of a PS plate (more specifically, it has a high ability of developing non-exposed areas, while it has a weak permeability into imagewise exposed areas. Moreover, the light-sensitive layer is dissolved without undergoing any swelling thereof and it is successively dissolved from the surface.)

Secondarily, it should be able to completely remove the light-sensitive layer on the non-exposed areas to thus regenerate the substrate surface as a hydrophilic one, which is never accompanied by any contamination of printed matter.

Thirdly, it should comprise a nonionic compound represented by the foregoing general formula (I) having a hydrophobic site capable of undergoing interaction with the foregoing developer-insoluble compounds and a hydrophilic site for dispersing and stabilizing the developer-insoluble compounds in water, in order to stably disperse or solubilize the developer-insoluble compounds.

Fourthly, it contain a chelating agent for the removal of any divalent metal such as Ca ions included in water. The divalent metal may be a factor, which makes the developing treatment unstable.

Regarding the first and second requirements among the foregoing ones, the characteristic properties of the components of the light-sensitive layer also become an important factor. There is not any restriction in case of the light-sensitive layer of, in particular, a photopolymerizable PS plate, but the fact that the acid value of the light-sensitive layer is low as compared with the conventional one is considered to be important for the achievement of a synergistic effect with the developer of the present invention, so far as one can presently know.

DETAILED DESCRIPTION OF THE INVENTION

The developer for a PS plate as well as the method for preparing a lithographic printing plate according to the present invention will hereunder be described in more detail.

First of all, the developing behaviors will be detailed below.

Rate of Development

The "rate of development" used herein can be determined by immersing the PS plate No. 4 which will be detailed below in a variety of developers at 28° C. without subjecting the PS plate to any imagewise exposure to thus determine the time required for the removal of the light-sensitive layer and for the exposure of the underlying substrate and to determine the rate of development in terms of the change in the thickness of the light-sensitive layer under development. In this respect, the higher the rate of development, the higher and better the developing characteristics of a specific developer.

Rate of Developing Non-exposed area=[Thickness of Light-Sensitive Layer ($\mu$m)]/[Time Required for the Completion of Development(s)]

Developer-penetration Rate

Figure 1:
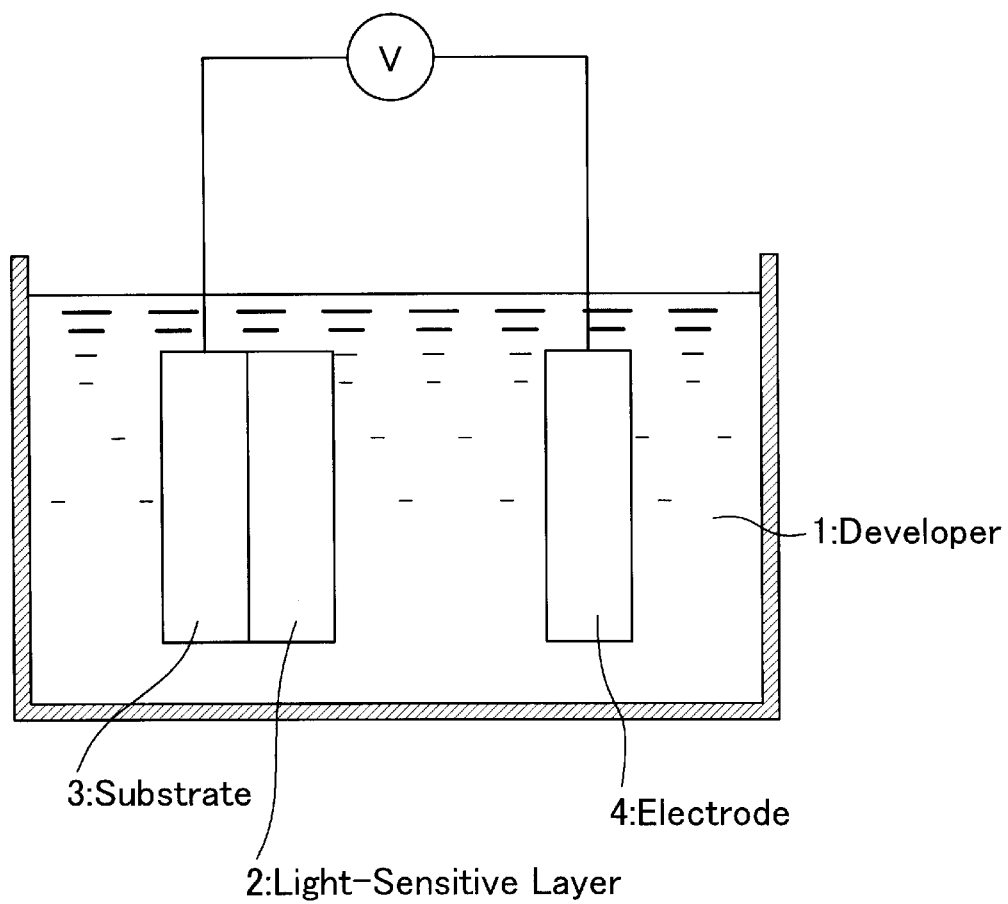
FIG. 1 shows schematically a device for determining a developer-penetration rate.
Figure 2:
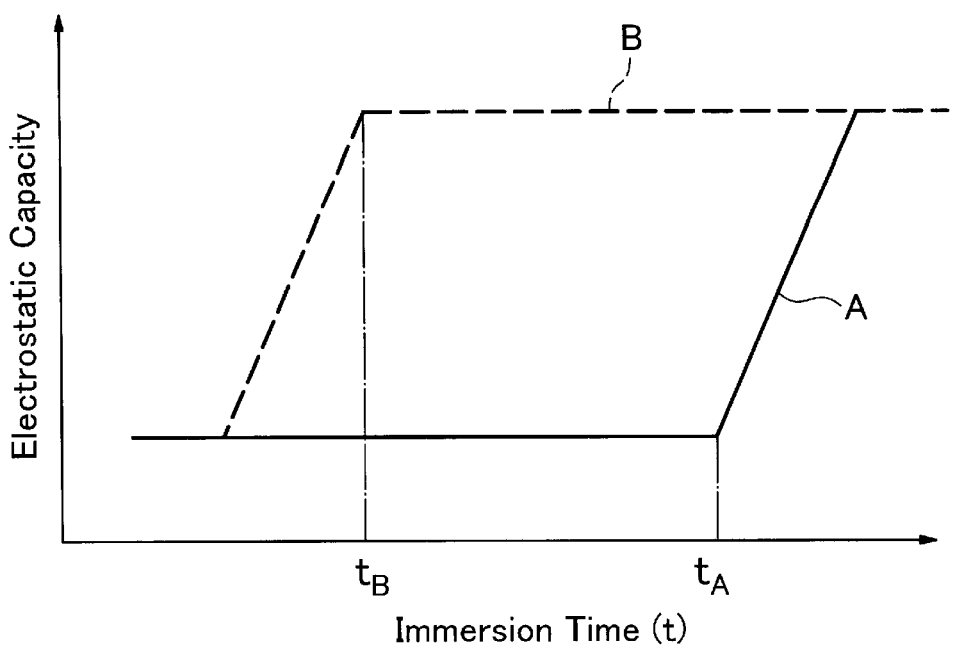
FIG. 2 shows schematically a graph on which results obtained by the device for determining a developer-penetration rate are plotted.

In this connection, a device for determining the developer-penetration rate and a graph on which the results obtained are plotted are shown schematically in FIG. 1 and FIG. 2, respectively. The "Developer-Penetration Rate" used herein can be determined by exposing, to light, the PS plate No. 4 which will be detailed below at a standard exposure value using various kinds of light sources for the exposure and then immersing the exposed PS plate in a variety of developers (1) at 28° C. to thus determine changes in the electrostatic capacity of the developer (1). More specifically, the time required for the penetration of a developer (1) into the light-sensitive layer (2) and for bringing the substrate (3) into contact with the developer (1) is determined by examining the time required for undergoing any change in the electrostatic capacity (in case where it is difficult to detect any inflection point in the electrostatic capacity curve, the developer-penetration rate is evaluated by determining the time required till the electrostatic capacity reaches 100 nF). The developer-penetration rate in the direction along the thickness of the light-sensitive layer can be calculated on the basis of the time thus determined. In this respect, the smaller the developer-penetration rate, the lower the ability of the developer to penetrate into the light-sensitive layer and the better the quality of the developer.

Rate of Developer-Penetration into Exposed Area=[Thickness of Light-Sensitive Layer ($\mu$m)]/[Time (s) at Which the Electrostatic Capacity Undergoes a Change]

Dissolution and Swelling of Light-sensitive Layer

Figure 3:
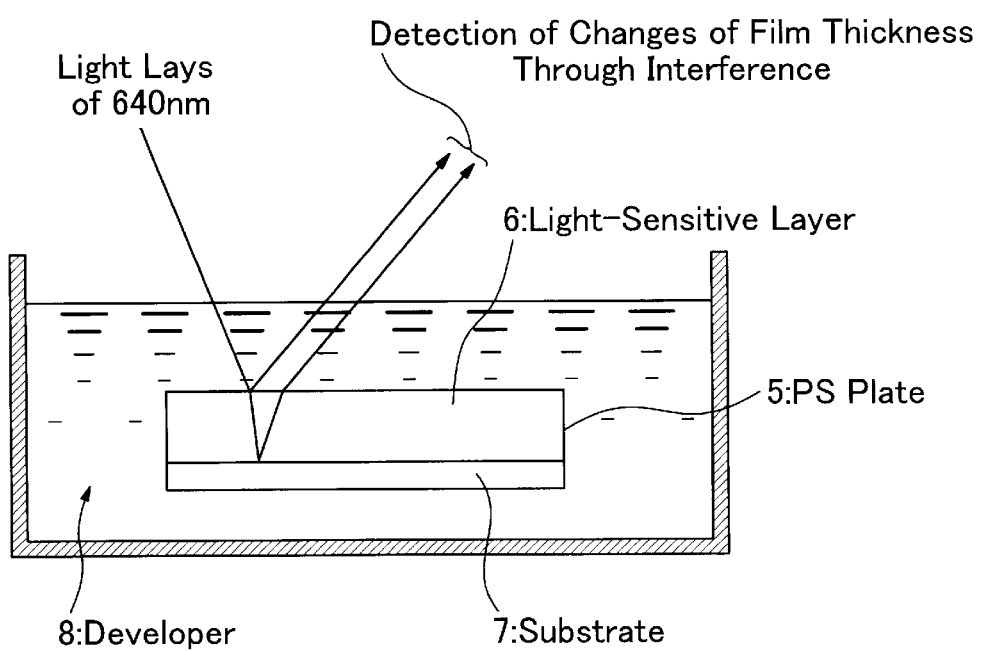
FIG. 3 shows schematically a DRM interference wave-measuring device used in determination of dissolution and swelling of light-sensitive layer.
Figure 4A:
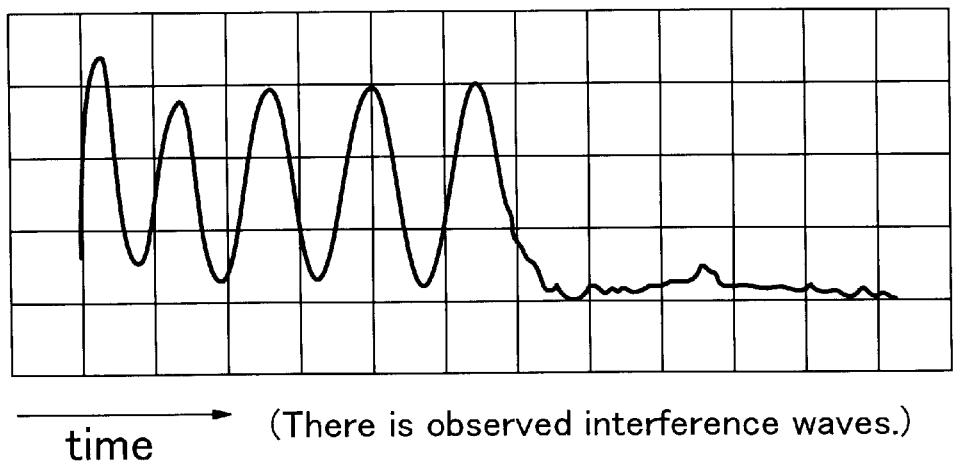
FIG. 4A shows the results on interference waves determined by the DRM interference wave-measuring device, in case of the invention.
Figure 4B:
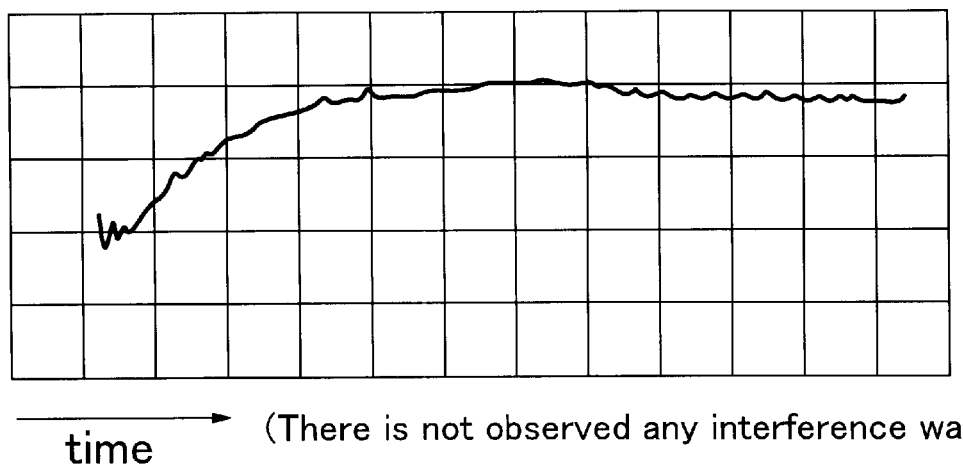
FIG. 4B shows the results on interference waves determined by the DRM interference wave-measuring device, in case of a conventional technique.

In this respect, a DRM interference wave-measuring device used in the determination of the dissolution and swelling of light-sensitive layer and the results determined are shown schematically in FIG. 3 and FIG. 4, respectively. The "dissolution (solubilization) and swelling of light-sensitive layer" used herein is determined by immersing the PS plate No. 4 which will be detailed below in a variety of developers at 30° C. without subjecting the PS plate to any imagewise exposure and then examining the dissolution behavior of the light-sensitive layer using a DRM interference wave-measuring device. In case where the development is successively taken place from the surface of the light-sensitive layer (6) without causing any swelling of the layer, the thickness of the light-sensitive layer is gradually reduced with the elapse of time and this results in the generation of an interference wave, which varies depending on the thickness of the light-sensitive layer (6). Contrary to this, in case of the development accompanied by swelling of the light-sensitive layer (dissolution with the removal of the layer), there is not observed any clear interference wave because of changes in the thickness of the layer through the penetration of the developer into the layer.

It is desirable that clear interference waves are formed and the dissolution and swelling of light-sensitive layer is herein evaluated on the basis of the presence of an interference wave.

The developer for a photopolymerizable PS plate according to the present invention (hereinafter possibly referred to as simply "developer") will be explained below.

The developer according to the present invention is fundamentally an alkaline aqueous solution comprising at least an alkali silicate and the nonionic compound represented by the formula (I). The alkali silicate is usually used in combination with a base, and the developer's pH ranges from 11.5 to 12.8, and preferably from 11.8 to 12.5.

The alkali silicate used in the developer of the present invention includes those showing an alkalinity when dissolved in water, for example, sodium silicate, potassium silicate, lithium silicate and ammonium silicate. Such alkali silicate may be used alone or in combination.

The developing performance of the alkaline aqueous solution may be easily modulated by adjusting a mixing ratio of silicon oxide ($SiO_2$) and an alkali oxide ($M_2O$, wherein M represents an alkali metal or an ammonium group) which are components of the alkali silicate, and concentrations thereof. In the developer according to the present invention, a molar ratio of $SiO_2/M_2O$ is suitably adjusted between 0.75 and 4.0, and preferably between 1.0 and 3.0. If the molar ratio, $SiO_2/M_2O$ is less than 0.75, the alkalinity of the solution will increase and possibly cause a harmful effect such as etching of an aluminum plate which is generally used as a substrate of a PS plate. If the molar ratio, $SiO_2/M_2O$ is more than 3.0, the developing performance of the solution may possibly be degraded.

The concentration of alkali silicate in the developer ranges generally from 0.1 to 3% by weight in terms of the amount of silicon dioxide ($SiO_2$), and preferably from 0.5 to 2% by weight. If said concentration is less than 0.1% by weight, the developing performance or treatment capacity may be degraded. If said concentration is more than 3% by weight, precipitates or crystals may be easily generated, and gelation may be easily caused during neutralization of waste liquid, resulting in an obstacle to the waste disposal.

The base which is used in combination with the alkali silicate may be selected from known alkaline agents which are conventionally used in a developer. Examples of the alkaline agents include inorganic alkaline agents such as sodium hydroxide, potassium hydroxide, lithium hydroxide, sodium tertiary phosphate, potassium tertiary phosphate, ammonium tertiary phosphate, sodium secondary phosphate, potassium secondary phosphate, ammonium secondary phosphate, sodium carbonate, potassium carbonate, ammonium carbonate, sodium bicarbonate, potassium bicarbonate, ammonium bicarbonate, sodium borate, potassium borate and ammonium borate, and potassium citrate, sodium citrate and the like. Preferable combination use of the above alkaline agents is a combination of an alkali metal hydroxide such as sodium hydroxide and potassium hydroxide with a carbonate such as sodium carbonate and potassium carbonate.

The alkaline agents which are usable also include organic alkaline agents such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanol amine, diisopropanolamine, ethyleneimine, ethylenediamine, pyridine, tetramethylammonium hydroxide and the like.

The above alkaline agent may be used alone or in combination.

Among these alkaline agents, preferred are sodium hydroxide and potassium hydroxide. Further, sodium tertiary phosphate, potassium tertiary phosphate, sodium carbonate and potassium carbonate are also preferable, since they have themselves, buffering action.

Nonionic Compound Represented by the Formula (I)

The developer according to the present invention further comprises a nonionic compound represented by the following general formula (I).

$$A—W \quad (I)$$

(In the formula, A represents a hydrophobic organic group whose logP as determined for A—H is not less than 1.5 and W represents a nonionic hydrophilic organic group whose logP as determined for W—H is less than 1.0).

LogP is generally used as a hydrophobic property parameter, which is described in C. Hansch, A. Leo, "Substituent Constants for Correlation Analysis in Chemistry and Biology", J. Wile & Sons, 1979. LogP is determined as follows: the object molecule (A—H and W—H) is distributed in a two-layers system of octanol/water to obtain a proportion of partition between octanol layer and water layer, a balanced concentration ratio P is calculated from said proportion, and logP is defined as a logarithmic value of said balanced concentration ratio P.

LogP herein is used as an index which identifies each of groups A and W. LogP herein denotes those obtained from the known data by calculation according to the method described in A. K. Ghose, et. Al. J. Comput. Chem. 9, 80 (1988), on the basis of A—H or W—H structure, which structure is made by linking hydrogen atom to each of the organic groups A and W, for the sake of simplicity.

Specifically, as a chemical structure of A and W, organic groups A and W are usually different from each other, and each of A and W represents a monovalent organic residue which satisfies the above definite logP value. More preferably, each of A and W represents a hydrogen atom, a halogen atom, a hydrocarbon radical which may have a substituent and/or an unsaturated bond, a heterocyclic group, a hydroxyl group, a substituted oxy group, a mercapto group, a substituted thio group, an amino group, a substituted amino group, a substituted carbonyl group, a carboxylate group, a sulfo group, a sulfonato group, a substituted sulfinyl group, a substituted sulfonyl group, a phosphono group, a substituted phosphono group, a phosphonato group, a substituted phosphonato group, a cyano group, a nitro group and the like.

Said hydrocarbon radical which may have a substituent and/or a unsaturated bond includes an alkyl group, a substituted alkyl group, an aryl group, a substituted aryl group, an alkenyl group, a substituted alkenyl group, an alkynyl group, a substituted alkynyl group and the like.

Said alkyl group includes a linear chain, branched chain or cyclic alkyl group having carbon atoms of from 1 to 20, specific examples thereof are methyl, ethyl, propyl, butyl, pentyl, hexyl, heptyl, octyl, nonyl, decyl, undecyl, dodecyl, tridecyl, hexadecyl, octadecyl, eicosyl, isopropyl, isobutyl, s-butyl, t-butyl, isopentyl, neopentyl, 1-methylbutyl, isohexyl, 2-ethylhexyl, 2-methylhexyl, cyclohexyl, cyclopentyl and 2-norbornyl groups and the like. Among these, preferred are a linear chain alkyl group having 1 to 12 carbon atoms, a branched chain alkyl group having 3 to 12 carbon atoms, and a cyclic alkyl group having 5 to 10 carbon atoms.

Said substituted alkyl group consists in a linkage of a substituent group and an alkylene group, and said substituent group includes a monovalent non-metallic atomic group other than a hydrogen atom. Preferred examples of the substituent group are halogen atoms (—F, —Br, —Cl and —I), hydroxyl, alkoxy, aryloxy, mercapto, alkylthio, arylthio, alkyldithio, aryldithio, amino, N-alkylamino, N,N-dialkylamino, N-arylamino, N,N-diarylamino, N-alkyl-N-arylamino, acyloxy, carbamoyloxy, N-alkylcarbamoyloxy, N-arylcarbamoyloxy, N,N-dialkylcarbamoyloxy, N,N-diarylcarbamoyloxy, N-alkyl-N-arylcarbamoyloxy, alkylsulfoxy, arylsulfoxy, acylthio, aminoacyl, N-alkylacylamino, N-arylacylamino, ureido, N'-alkylureido, N',N'-dialkylureido, N'-arylureido, N',N'-diarylureido, N'-alkyl-N'-arylureido, N-alkylureido, N-arylureido, N'-alkyl-N-alkylureido, N'-alkyl-N-arylureido, N', N'-dialkyl-N-alkylureido, N', N'-dialkyl-N-arylureido, N'-aryl-N-alkylureido, N'-aryl-N-arylureido, N',N'-diaryl-N-alkylureido, N',N'-diaryl-N-arylureido, N'-alkyl-N'-aryl-N-alkylureido, N'-alkyl-N'-aryl-N-arylureido, alkoxycarbonylamino, aryloxycarbonylamino, N-alkyl-N-alkoxycarbonylamino, N-alkyl-N-aryloxycarbonylamino, N-aryl-N-alkoxycarbonylamino, N-aryl-N-aryloxycarbonylamino, formyl, acyl, carboxyl group and conjugate base group thereof (hereinafter referred to as carboxylate), alkoxycarbonyl, aryloxycarbonyl, carbamoyl, N-alklcarbamoyl, N,N-dialkylcarbamoyl, N-arylcarbamoyl, N,N-diarylcarbamoyl, N-alkyl-N-arylcarbamoyl, alkylsulfinyl, arylsulfinyl, arylsulfonyl, sulfo (—SO$_3$H) and conjugate base group thereof (hereinafter referred to as sulfonato), alkoxysulfonyl, aryloxysulfonyl, sulfinamoyl, N-alkylsulfinamoyl, N,N-diarylsulfinamoyl, N-arylsulfinamoyl, N,N-diarylsulfinamoyl, N-alkyl-N-arylsulfinamoyl, sulfamoyl N-alkylsulfamoyl, N,N-dialkylsulfamoyl, N-arylsulfamoyl, N,N-diarylsulfamoyl, N-alkyl-N-arylsulfamoyl, N-acylsulfamoyl and conjugate base group thereof, N-alkylsulfonylsulfamoyl (—SO$_2$NHSO$_2$(alkyl)) and conjugate base group thereof, N-arylsulfonylsulfamoyl (—SO$_2$NHSO$_2$(aryl)) and conjugate base group thereof, N-alkylsulfonylcarbamoyl (—CONHSO$_2$(alkyl)) and conjugate base group thereof, N-arylsulfonylcarbamoyl (—CONHSO$_2$(aryl)) and conjugate base group thereof, alkoxysilyl (—Si(O-alkyl)$_3$), aryloxysilyl (—Si(O-aryl)$_3$), hydroxysilyl (—Si(OH)$_3$) and conjugate base group thereof, phosphono (—PO$_3$H$_2$) and conjugate base group thereof (hereinafter referred to as phosphonato), dialkylphosphono (—PO$_3$(alkyl)$_2$), diarylphosphono (—PO$_3$(aryl)$_2$), alkylarylphosphono (—PO$_3$(alkyl)(aryl)), monoalkylphosphono (—PO$_3$H(alkyl)) and conjugate base group thereof (hereinafter referred to as alkylphosphonato), monoarylphosphono (—PO$_3$H(aryl)) and conjugate base group thereof (hereinafter referred to as arylphosphonato), phosphonoxy (—OPO$_3$H$_2$) and conjugate base group thereof (hereinafter referred to as phosphonatoxy), dialkylphosphonoxy (—OPO$_3$(alkyl)$_2$), diarylphosphonoxy (—OPO$_3$(aryl)$_2$), alkylarylphosphonoxy (—OPO$_3$(alkyl)(aryl)), monoalkylphosphonoxy (—OPO$_3$H(alkyl)) and conjugate base group thereof (hereinafter referred to as alkylphosphonatoxy), monoarylphosphonoxy (—OPO$_3$H(aryl)) and conjugate base group thereof (hereinafter referred to as arylphosphonatoxy), cyano, nitro, aryl, alkenyl and alkynyl groups and the like.

Said alkyl group on the above substituent includes alkyl groups as described above. Specific examples of the aryl group on the above substituent are phenyl, biphenyl, naphthyl, tolyl, xylyl, mesityl, cumenyl, fluorophenyl, chlorophenyl, bromophenyl, chloromethylphenyl, hydroxyphenyl, methoxyphenyl, ethoxyphenyl, phenoxyphenyl, acetoxyphenyl, benzoyloxyphenyl, methylthiophenyl, phenylthiophenyl, methylaminophenyl, dimethylaminophenyl, acetylaminophenyl, carboxyphenyl, methoxycarbonylphenyl, ethoxycarbonylphenyl, phenoxycarbonylphenyl, N-phenylcarbamoylphenyl, phenyl, nitrophenyl, cyanophenyl, sulfophenyl, sulfonatophenyl, phosphonophenyl and phosphonatophenyl groups. Specific examples of the alkenyl group are vinyl, 1-propenyl, 1-butenyl, cinnamyl and 2-chloro-1-ethenyl groups and the like. Specific examples of the alkynyl group are ethynyl, 1-propynyl, 1-butynyl, trimethylsilylethynyl and phenylethynyl groups and the like.

Said acyl group (R$^4$CO—) includes those wherein R$^4$ is hydrogen atom, the above described alkyl, aryl, alkenyl or alkynyl group.

The alkylene group in the substituted alkyl group includes a bivalent organic residue which is shown by excepting any one hydrogen atom on the above mentioned alkyl group having carbon atoms of from 1 to 20, and preferred are a linear chain alkylene group having carbon atoms of from 1 to 12, a branched chain alkylene group having carbon atoms of from 3 to 12 and a cyclic alkylene group having carbon atoms of from 5 to 10.

Examples of the preferred substituted alkyl group are chloromethyl, bromomethyl, 2-chloroethyl, trifluoromethyl, methoxymethyl, methoxyethoxyethyl, allyloxymethyl, phenoxymethyl, methylthiomethyl, tolylthiomethyl, ethylaminoethyl, diethylaminopropyl, morpholinopropyl, acetyloxymethyl, benzoyloxymethyl, N-cyclohexylcarbamoyloxyethyl, N-phenylcarbamoyloxyethyl, acetylaminoethyl, N-methylbenzoylaminopropyl, 2-oxoethyl, 2-oxopropyl, carboxypropyl, methoxycarbonylethyl, methoxycarbonylmethyl, methoxycarbonylbutyl, ethoxycarbonylmethyl, butoxycarbonylmethyl, allyloxycarbonylmethyl, benzyloxycarbonylmethyl, methoxycarbonylphenylmethyl, trichloromethylcarbonylmethyl, allyloxycarbonylbutyl, chlorophenoxycarbonylmethyl, carbamoylmethyl, N-methylcarbamoylethyl, N,N-dipropylcarbamoylmethyl, N-(methoxyphenyl)carbamoylethyl, N-methyl-N-(sulfophenyl)carbamoylmethyl, sulfopropyl, sulfobutyl, sulfonatobutyl, sulfamoylbutyl, N-ethylsulfamoylmethyl, N,N-dipropylsulfamoylpropyl, N-tolylsulfamoylpropyl, N-methyl-N-(phosphonophenyl)sulfamoyloctyl,

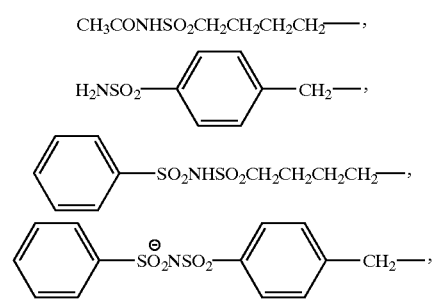

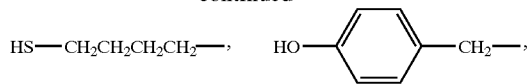

phosphonobutyl, phosphonatohexyl, diethylphosphonobutyl, diphenylphosphonopropyl, methylphosphonobutyl, methylphosphonato butyl, tolylphosphonohexyl, tolylphosphonato hexyl, phosphonoxypropyl, phosphonatoxybutyl, benzyl, phenethyl, a-methylbenzyl, 1-methyl-1-phenylethyl, p-methylbenzyl, cinnamyl, allyl, 1-propenylmethyl, 2-butenyl, 2-methylallyl, 2-methylpropenylmethyl, 2-propynyl, 2-butynyl and 3-butynyl groups and the like.

The aryl group includes a monocyclic group and a condensed-ring group such as those are formed from condensation of from 1 to 3 benzene rings, condensation of a benzene ring and five-membered unsaturated ring, and the like. Examples of the aryl group are phenyl, naphthyl, anthryl, phenanthryl, indenyl, acenaphthenyl and fluorenyl groups and the like. Among these, phenyl and naphthyl groups are preferable.

Said substituted aryl group consists of binding of a substituent group to an aryl group. As a substituent group bonding to a carbon atom which is a ring-forming member of the aryl group, a monovalent non-metallic atomic group other than a hydrogen atom is exemplified. Preferred examples of the substituent group include the alkyl groups, the substituted alkyl groups and the substituent groups on the substituted alkyl groups as described above. Specific examples of preferred substituted aryl group are biphenyl, tolyl, xylyl, mesityl, cumenyl, chlorophenyl, bromophenyl, fluorophenyl, chloromethylphenyl, trifluoromethylphenyl, hydroxyphenyl, methoxyphenyl, methoxyethoxyphenyl, allyloxyphenyl, phenoxyphenyl, methylthiophenyl, tolylthiophenyl, phenylthiophenyl, ethylaminophenyl, diethylaminophenyl, morpholinophenyl, acetyloxyphenyl, benzoyloxyphenyl, N-cyclohexylcarbamoyloxyphenyl, N-phenylcarbamoyloxyphenyl, acetylaminophenyl, N-methylbenzoylaminophenyl, carboxyphenyl, methoxycarbonylphenyl, allyloxycarbonylphenyl, chlorophenoxycarbonylphenyl, carbamoylphenyl, N-methylcarbamoylphenyl, N,N-dipropylcarbamoylphenyl, N-(methoxyphenyl)carbamoylphenyl, N-methyl-N-(sulfophenyl)carbamoylphenyl, sulfophenyl, sulfonato phenyl, sulfamoylphenyl, N-ethylsulfamoylphenyl, N,N-cdipropylsulfamoylphenyl, N-tolylsulfamoylphenyl, N-methyl-N-(phosphonophenyl)sulfamoylphenyl, phosphonophenyl, phosphonato phenyl, diethylphosphonophenyl, diphenylphosphonophenyl, methylphosphonophenyl, methylphosphonato phenyl, tolylphosphonophenyl, tolylphosphonato phenyl, allylphenyl, 1-propenylmethylphenyl, 2-butenylphenyl, 2-methylallylphenyl, 2-methylpropenylphenyl, 2-propynylphenyl, 2-butynylphenyl and 3-butynylphenyl groups and the like.

The alkenyl group includes those described above. The substituted alkenyl group consists of replacing a hydrogen atom in the alkenyl group with a substituent group which bonds thereto. The substituent group includes the groups which are described above as substituents on the substituted alkyl group, and the alkenyl group includes those described above. Specific examples of preferred substituted alkenyl group are shown below.

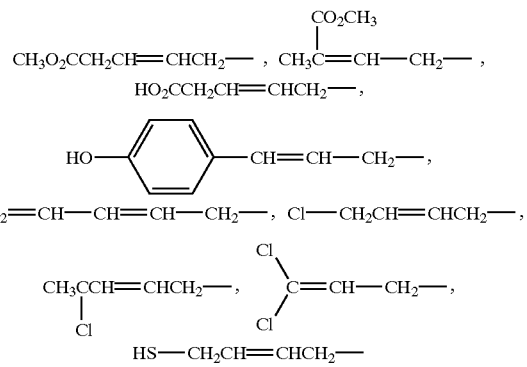

The alkynyl group includes those described above. The substituted alkynyl group consists of replacing a hydrogen atom in the alkynyl group with a substituent group which bonds thereto. The substituent group includes the groups which are described above as substituents on the substituted alkyl group, and the alkynyl group includes those described above.

The heterocyclic group includes a monovalent group which is shown by excepting any one hydrogen atom on a heterocycle, and a monovalent group which is shown by excepting any one hydrogen atom on the above monovalent group and linking thereto a substituent group which is described above as a substituent group in the substituted alkyl group, such monovalent group being referred to as a substituted heterocyclic group. Specific examples of preferred heterocyclic group are shown below.

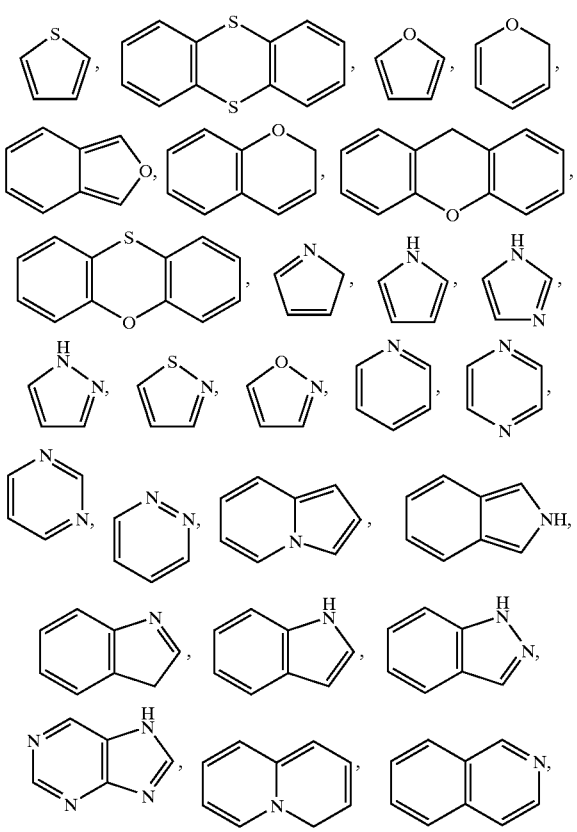

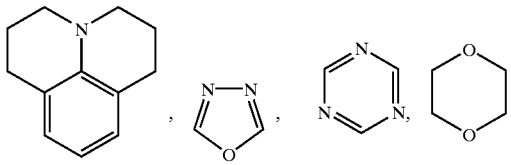

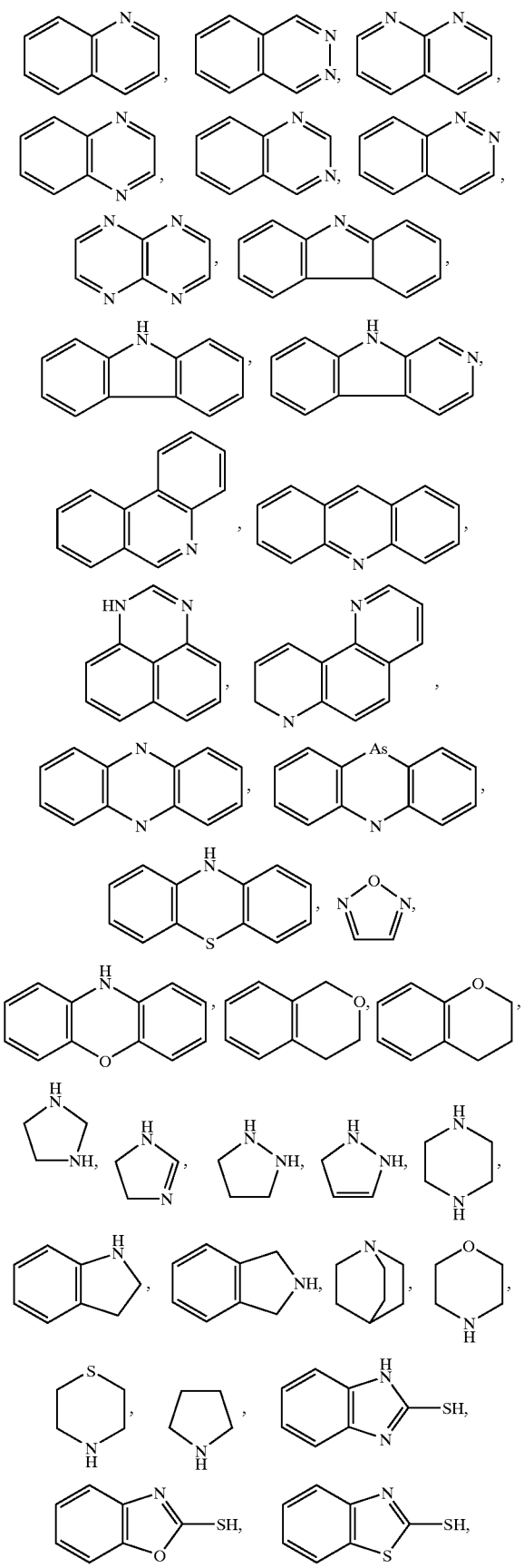

The substituted oxy group (R⁵O—) includes those wherein $R^5$ is a monovalent non-metallic atomic group other than a hydrogen atom. Preferred substituted oxy group includes alkoxy, aryloxy, acyloxy, carbamoyloxy, N-alkylcarbamoyloxy, N-arylcarbamoyloxy, N,N-dialkylcarbamoyloxy, N,N-diarylcarbamoyloxy, N-alkyl-N-arylcarbamoyloxy, alkylsulfoxy, arylsulfoxy, phosphonoxy and phosphonato oxy groups and the like. The alkyl group and the aryl group in the above oxy group may be the above mentioned alkyl, substituted alkyl, aryl and substituted aryl groups.

The acyl group (R⁶CO—) in said acyloxy group includes those wherein $R^6$ is the above mentioned alkyl, substituted alkyl, aryl and substituted aryl groups. Preferable substituent groups in the above group are alkoxy, aryloxy, acyloxy and arylsulfoxy groups and the like. Specific examples of preferred substituted oxy group are methoxy, ethoxy, propyloxy, isopropyloxy, butyloxy, pentyloxy, hexyloxy, dodecyloxy, benzyloxy, allyloxy, phenethyloxy, carboxyethyloxy, methoxycarbonylethyloxy, ethoxycarbonylethyloxy, methoxyethoxy, phenoxyethoxy, methoxyethoxyethoxy, ethoxyethoxyethoxy, morpholinoethoxy, morpholinoethoxy, morpholinopropyloxy, allyloxyethoxyethoxy, phenoxy, tolyloxy, xylyloxy, mesityloxy, cumenyloxy, methoxyphenyloxy, ethoxyphenyloxy, chlorophenyloxy, bromophenyloxy, acetyloxy, benzoyloxy, naphthyloxy, phenylsulfonyloxy, phosphonoxy and phosphonato oxy groups and the like.

The substituted thio group (R⁷S—) includes those wherein $R^7$ is a monovalent non-metallic atomic group other than a hydrogen atom. Preferable substituted thio groups are alkylthio, arylthio, alkyldithio, aryldithio and acylthio groups and the like. The alkyl and aryl groups in the above thio group include the above mentioned alkyl, substituted alkyl, aryl and substituted aryl groups, and the acyl geurp group (R⁶CO—) in the above acylthio group is as described above. Among these, alkylthio and aryl thio groups are preferable. Specific examples of preferred substituted thio groups are methylthio, ethylthio, phenylthio, ethoxyethylthio, carboxyethylthio and methoxycarbonylthio groups and the like.

The substituted amino group (R⁸NH—, (R⁹)(R¹⁰)N—) includes those wherein $R^8$, $R^9$, $R^{10}$ are a monovalent non-metallic atomic group other than a hydrogen atom. Preferable examples of the substituted amino group are N-alkylamino, N,N-dialkylamino, N-arylamino, N,N-diarylamino, N-alkyl-N-arylamino, acylamino, N-alkylacylamino, N-arylacylamino, ureido, N'-alkylureido, N',N'-dialkylureido, N'-arylureido, N',N'-diarylureido, N'-alkyl-N'-arylureido, N-alkylureido, N-arylureido, N'-alkyl-N-alkylureido, N'-alkyl-N-arylureido, N'-N'-dialkyl-N-alkylureido, N',N'-dialkyl-N-arylureido, N'-aryl-N-alkylureido, N'-aryl-N-arylureido, N', N'-diaryl-N-alkylureido, N',N'-diaryl-N-arylureido, N'-alkyl-N'-aryl-N-alkylureido, N'-alkyl-N'-aryl-N-arylureido, alkoxycarbonylamino, aryloxycarbonylamino, N-alkyl-N-alkoxycarbonylamino, N-alkyl-N-aryloxycarbonylamino, N-aryl-N-alkoxycarbonylamino and N-aryl-N- aryloxycarbonylamino groups and the like. The alkyl and aryl groups in the above amino groups include the above mentioned alkyl, substituted alkyl, aryl and substituted aryl groups, and the acyl gourp ($R^6CO$—) in the above acylamino, N-alkylacylamino and N-arylacylamino groups is as described above. Among these, more preferred are N-alkylamino, N,N-dialkylamino, N-arylamino and acylamino groups and the like. Specific examples of preferable substituted amino group are methylamino, ethylamino, diethylamino, morpholino, piperidino, phenylamino, benzoylamino and acetylamino groups and the like.

The substituted carbonyl group ($R^{11}$-CO—) includes those wherein $R^{11}$ is a monovalent non-metallic atomic group. Examples of the substituted carbonyl group are formyl, acyl, carboxyl, alkoxycarbonyl, aryloxycarbonyl, carbamoyl, N-alkylcarbamoyl, N,N-dialkylcarbamoyl, N-arylcarbamoyl, N,N-diarylcarbamoyl and N-alkyl-N-arylcarbamoyl groups and the like. The alkyl and aryl groups in the above substituted carbonyl groups include the above mentioned alkyl, substituted alkyl, aryl and substituted aryl groups. Among these, preferable substituted carbonyl groups are formyl, acyl, carboxyl, alkoxycarbonyl, aryloxycarbonyl, carbamoyl, N-alkylcarbamoyl, N,N-dialkylcarbamoyl and N-arylcarbamoyl groups and the like, and more preferred are formyl, acyl, alkoxycarbonyl and aryloxycarbonyl groups and the like. Specific examples of the substituted carbonyl group are formyl, acetyl, benzoyl, carboxyl, methoxy carbonyl, allyloxycarbonyl, N-methylcarbamoyl, N-phenylcarbamoyl, N,N-diethylcarbamoyl and morpholinocarbonyl groups and the like.

The substituted sulfinyl group ($R^{12}$—SO—) includes those wherein $R^2$ is a monovalent non-metallic atomic group. Examples of the substituted sulfinyl group are alkylsulfmyl, arylsulfinyl, sulfinamoyl, N-alkylsulfinamoyl, N,N-dialkylsulfinamoyl, N-arylsulfinamoyl, N,N-diarylsulfinamoyl, N-alkyl-N-arylsulfinamoyl and N-alkyl-N-arylsulfinamoyl groups and the like. The alkyl and aryl groups in the above substituted sulffiyl groups include the above mentioned alkyl, substituted alkyl, aryl and substituted aryl groups. Among these, preferable substituted sulfinyl groups are alkylsulfinyl and arylsulfinyl groups and the like. Specific examples of the substituted sulfinyl groups are hexylsullfinyl, benzylsulfinyl and tolylsulfinyl groups and the like.

The substituted sulfonyl group ($R^{13}$—SO$_2$—) includes those wherein $R^{13}$ is a monovalent non-metallic atomic group. Preferable examples of the substituted sulfonyl group are alkylsulfonyl and arylsulfonyl groups and the like. The alkyl and aryl groups in the above substituted sulfonyl group include the above mentioned alkyl, substituted alkyl, aryl and substituted aryl groups. Specific examples of the substituted sulfonyl group are butylsulfonyl and chlorophenylsulfonyl groups and the like.

The sulfonato group (—SO$_3$—) denotes a conjugate base anionic ion group of a sulfo group (—SO$_3$H) as described above, and normally the sulfonate group is preferably used with a counter cationic ion. Said counter cationic ion includes those generally known, for example, various oniums such as ammoniums, sulfoniums, phosphoniums, iodoniums, aziniums and the like, and metallic ions such as $Na^+$, $K^+$, $Ca^{2+}$, $Zn^{2+}$ and the like.

The carboxylate group (—CO$_2$—) denotes a conjugate base anionic ion groups of a carboxyl group (—CO2H) as described above, and normally the carboxylate group is preferably used with a Router counter cationic ion. Said counter cationic ion includes those generally known, for example, various oniums such as ammoniums, sulfoniums, phosphoniums, iodoniums, aziniums and the like, and metallic ions such as $Na^+$, $K^+$, $Ca^{2+}$, $Zn^{2+}$ and the like.

The substituted phosphono group denotes a group consisting of replacing one or two hydroxyl groups in a phosphono group with an organic oxo group which differs from a hydroxyl group. Preferable examples of the substituted phosphono group are dialkylphosphono, diarylphosphono, alkylarylphosphono, monoalkylphosphono and monoarylphosphono groups and the like. The alkyl and aryl groups in the above substituted phosphono group include the above mentioned alkyl, substituted alkyl, aryl and substituted aryl groups. Among these, dialkylphosphono and diarylphosphono groups are preferable. Specific examples of these groups are diethylphosphono, dibutylphosphono, diphenylphosphono groups and the like.

The phosphonato group (—PO$_3^{2-}$, —PO$_3$H$^-$—) denotes a conjugate base anionic ion groups derived from an acid first-dissociation or an acid second-dissociation of a phosphono group (—PO$_3$H) as described above. Normally the phosphonate group is preferably used with a counter cationic ion. Said counter cationic ion includes those generally known, for example, various oniums such as ammoniums, sulfoniums, phosphoniums, iodoniums, aziniums and the like, and metallic ions such as $Na^+$, $K^+$, $Ca^{2+}$, $Zn^{2+}$ and the like.

The substituted phosphonato group is a conjugate base anionic ion group of the above mentioned substituted phosphono group which consists of replacing one hydroxyl group in a phosphono group with an organic oxo group. Examples of the substituted phosphonate group are a conjugate base of the above mentioned monoalkylphosphono group (—PO$_3$H(alkyl)) and monoarylphosphono group (—PO$_3$H(aryl)). Normally the substituted phosphonate group is preferably used with a counter cationic ion. Said counter cationic ion includes those generally known, for example, various oniums such as ammoniums, sulfoniums, phosphoniums, iodoniums, aziniums and the like, and metallic ions such as $Na^+$, $K^+$, $Ca^{2+}$, $Zn^{2+}$ and the like.

In the formula (I), structure of A is preferably an organic group comprising an aromatic group, and structure of W is preferably a nonionic organic group comprising a polyoxyalkylene group.

Examples of A—H and W—H are shown below.

EXAMPLES OF A—H

logP = 2.05

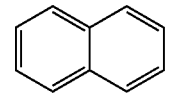

3.05

③

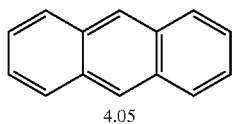
4.05

④

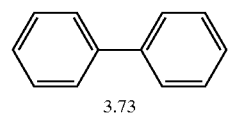
3.73

⑤

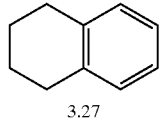
3.27

⑥

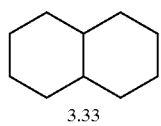
3.33

⑦

2.38

⑧ a linear or branched chain $C_nH_{2n+2}$ (n is an integer $\geq 4$) logP of 2.09 in case of butane ⑨ a linear or branched chain $C_nH_{2n}$ (n is an integer $\geq 4$)

⑩ a linear or branched chain $C_nH_{2n-2}$ (n is an integer $\geq 4$)

Any hydrogen atom on the above structures ①-⑩ may be replaced with the above described substituent group on the hydrocarbon radicals.

EXAMPLES OF W—H

①

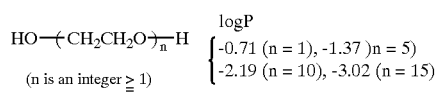

logP
-0.71 (n = 1), -1.37 (n = 5)
-2.19 (n = 10), -3.02 (n = 15)

②

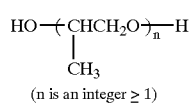
(-0.30 (n = 1), -0.70 (n =5))

③

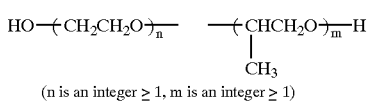

④

$HS-(CH_2CH_2O)_n-H$
(n is an integer $\geq 1$)

⑤

$HO-(CH_2CH_2CH_2O)_n-H$
(n is an integer $\geq 1$)

⑥

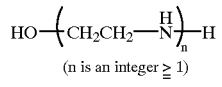
(n is an integer $\geq 1$)

⑦

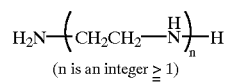
(n is an integer $\geq 1$)

⑧

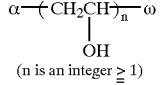
(n is an integer $\geq 1$)

⑨

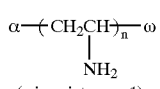
(n is an integer $\geq 1$)

⑩

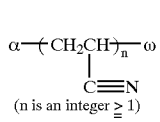
(n is an integer $\geq 1$)

⑪

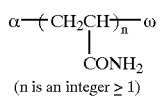
(n is an integer $\geq 1$)

⑫

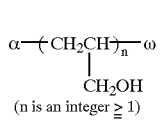
(n is an integer $\geq 1$)

⑬

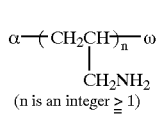
(n is an integer $\geq 1$)

⑭

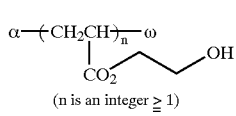
(n is an integer $\geq 1$)

In the above ①-⑧, α and ω each represents —OH, —H, —SH or —NH$_2$. A hydrogen atom on the above structures ①-⑭ may be replaced with the above described substituent group on the hydrocarbon radicals.

Specific examples of the compound represented by the formula (I) are shown below.

[Examples of Compound represented by the Formula (I)]
A—W
| | |
|---|---|
| Y-1 | 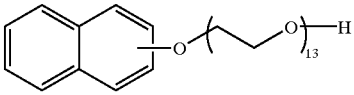 |
| Y-2 | 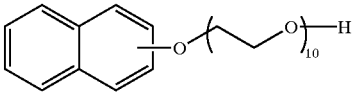 |
| Y-3 | 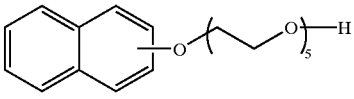 |
| Y-4 | 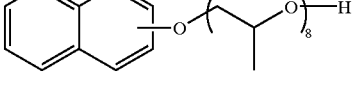 |
| Y-5 | 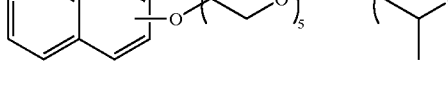 |
| Y-6 | 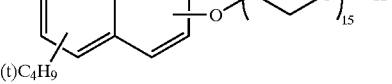 |
| Y-7 | 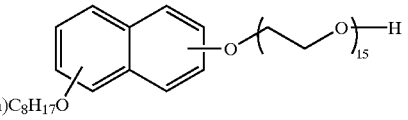 |
| Y-8 | 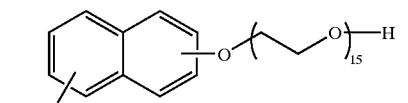 |
| Y-9 | 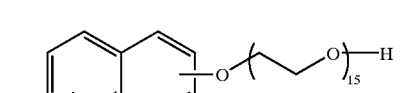 |
| Y-10 | 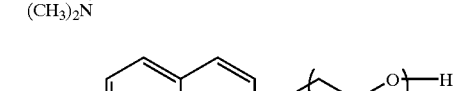 |
| Y-11 | 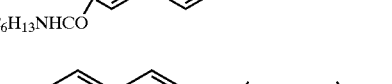 |
| Y-12 | 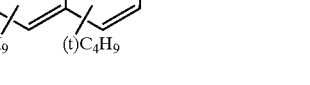 |
| Y-13 | 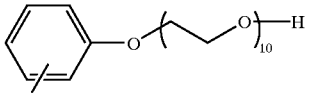 |
| Y-14 | 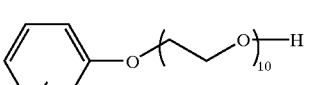 |
| Y-15 | 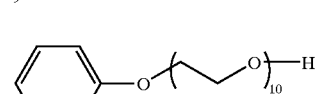 |
| Y-16 |  |
| Y-17 |  |
| Y-18 | 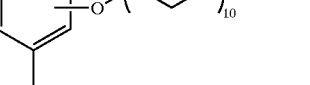 |
| Y-19 | 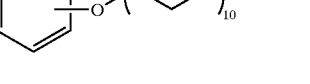 |
| Y-20 |  |
| Y-21 |  |

[Examples of Compound represented by the Formula (I)]

A—W

Y-22

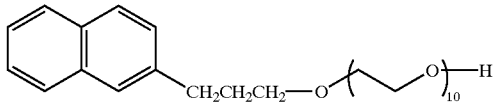

Preferred examples of the nonionic compound of the formula (I) includes the compound represented by the following formula (I-A) or (I-B).

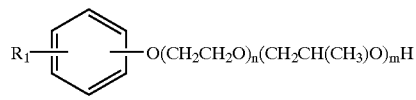
(I-A)

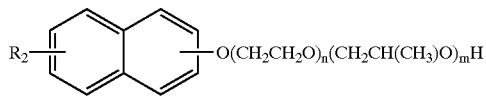
(I-B)

wherein $R_1$ and $R_2$ each represents H or an alkyl group having 1 to 100 carbon atoms and n and m each represents an integer ranging from 0 to 100, provided that n and m are not simultaneously zero.

The compound represented by the formula (I-A) includes polyoxyethylene phenylether, polyoxyethylene methylphenylether, polyoxyethylene octylphenylether, polyoxyethylene nonylphenylether and the like.

The compound represented by the formula (I-B) includes polylxyethylenc polyoxyethylene naphthylether, polyoxyethylene methylnaphthylether, polyoxyethylene octylnaphthylether, polyoxyethylene nonylnaphthylether and the like.

In the compound represented by the formula (I-A) or (I-B), the number of repeating unit in a polyoxyethylene chain is preferably from 3 to 50, and more preferably from 5 to 30. The number of repeating unit in a polyoxypropylene chain is preferably from 0 to 10, and more preferably from 0 to 5. In the compound of the formula (I), a polyoxyethylene moiety and a polyoxypropylene moiety may be arrayed in the form of a random or block copolymer.

The nonionic compound of the formula (I), for example, the nonionic aromatic ether represented by the formula (I-A) or (I-B) may be used alone or in any combination of at least two of them.

According to the present invention, the amount of the nonionic compound represented by the formula (I) in the developer ranges generally from 0.1 to 15% by weight, and preferably from 1.0 to 8.0% by weight. If the amount is too small, the developing performance and ability in dissolving components of a light-sensitive layer will be degraded. If the amount is too large, printing durability of a printing plate will be degraded.

Chelating Agent

The developer of the present invention may comprise a chelating agent. Such chelating agent includes polyphosphates such as $Na_2P_2O_7$, $Na_5P_3O_3$, $Na_3P_3O_9$, $Na_2O_4P$ $(NaO_3P)PO_3Na_2$ and Calgon (trade mane of sodium polymetaphosphate, available from Calgon Inc, (USA)); polyaminocarboxylic acids and salts thereof such as ethylenediaminetetraacetic acid and potassium and sodium salts thereof, diethylenetriaminepentaacetic acid and potassium and sodium salts thereof, triethylenetetraminehexaacetic acid and potassium and sodium salts thereof, hydroxyethylethylenediaminetriacetic acid and potassium and sodium salts thereof, nitrilotriacetic acid and potassium and sodium salts thereof, 1,2-diaminocyclohexanetetraacetic acid and potassium and sodium salts thereof and 1,3-diamino-2-propanoltetraacetic acid and potassium and sodium salts thereof; and organophosphonic acids, potassium, sodium and ammonium salts thereof such as 2-phosphonobutane tricarboxylic acid-1,2,4 and potassium and sodium salts thereof, 2-phosphonobutanone tricarboxylic acid-2,3,4 and potassium and sodium salts thereof, 1-phosphonoethane tricarboxylic acid-1,2,2 and potassium and sodium salts thereof, 1-hydroxyethane-1,1-diphosphonic acid and potassium and sodium salts thereof and amino tri(methylene phosphonic acid) and potassium and sodium salts thereof. The optimum amount of the chelating agent varies depending on the hardness and the amount of hard water used, but the amount thereof in general ranges from 0.01 to 5% by weight and preferably 0.01 to 0.5% by weight in the developer practically used.

Surfactant

The developer according to the present invention may further comprise surfactants shown below, which is other than the nonionic compound represented by the formula (I).

The surfactant includes a nonionic surfactant including polyoxyethylene alkylethers such as polyoxyethylene laurylether, polyoxyethylene cetylether and polyoxyethylene stearylether; polyoxyethylene alkylarylethers such as polyoxyethylene octylphenylether and polyoxyethylene nonylphenylether; polyoxyethylene alkylesters such as polyoxyethylene stearate; and sorbitan alkylesters such as sorbitan monolaurate, sorbitan monostearate, sorbitan distearate, sorbitan monooleate, sorbitan sesquioleate and sorbitan trioleate; an anionic surfactant including alkylbenzene sulfonic acid salts such as sodium dodecylbenzenesulfonate; alkylnaphthalene sulfonic acid salts such as sodium butylnaphthalenesulfonate, sodium pentylnaphthalenesulfonate, sodium hexylnaphthalenesulfonate and sodium octylnaphthalenesulfonate; alkylsulfuric acid salts such as dodecyl sodium sulfate; alkyl sulfonic acid salts such as sodium dodecylsulfonate; and sulfosuccinate salts such as dilauryl sodium sulfosuccinate; and an amphoteric surfactant including alkylbetaines such as laurylbetaine and stearylbetaine; and amino acids type-amphoteric surfactants, and preferred among these are anionic surfactants such as alkylnaphthalene sulfonic acid salts and the like. The surfactant may be used alone or in any combination of at least two of them. The amount of the surfactant in the developer ranges generally from 0.1 to 20% by weight in terms of the effective component thereof.

Others

The developer according to the present invention may further comprise as occasion demands, other components than those described above. Such components include organic carboxylic acids such as benzoic acid, phthalic acid, p-ethyl benzoic acid, p-n-propyl benzoic acid, p-isopropyl benzoic acid, p-n-butyl benzoic acid, p-t-butyl benzoic acid, p-2-hydroxyethyl benzoic acid, decanoic acid, salicylic acid, 3-hydroxy-2-naphthoic acid and the like; organic solvents such as isopropyl alcohol, benzyl alcohol, ethyl cellosolve, butyl cellosolve, phenyl cellosolve, propylene glycol, diacetone alcohol and the like; a reducing agent; a colorant dye; a pigment; a water softener, an antiseptic agent and the like.

When an automatic processor is used to perform development procedure in the plate-making method according to the present invention, the developer becomes exhausted depending on throughput amount of plates and a replenisher or flesh developer may be used to restore the throughput capacity of developer.

Conductivity

The developer according to the present invention has suitably a conductivity of from 3 to 30 mS/cm and preferably from 3 to 15 mS/cm in the light of a developing speed.

Foaming Property

Foaming property of the developer may be determined by the following procedure: 30 ml of the developer is poured into a transparent glass bottle having a volume of 100 ml and an inner diameter of 3 cm, the glass bottle is shaken up and down at a speed of 3 times per one second for one minute at a temperature of 25° C., then the glass bottle is allowed to stand so as to determine the time which is taken until the generated foam disappears (foam-disappearing time). When said time is smaller, the foaming property of the developer is lower and favorable, in other words, anti-foaming property is higher.

The developer of the present invention has preferably the lower foaming property and a foam-disappearing time of not more than 5 minutes which is determined by the above procedure. Thus the developer of the present invention does not cause an obstacle due to foaming during development processing procedure.

Color

The developer of the present invention may be colorless or preferably as colored as visually recognized so as to avoid a false recognition between the developer and water.

Viscosity

The developer of the present invention has generally a viscosity of from 1.0 to 10.0 cp in the form of diluted solution at a temperature of 25° C. so that development processing procedure can be smoothly performed.

PS Plate

The present invention will now be explained in detail with respect to the PS plate for use in making a lithographic printing plate.

The PS plate for use in the present invention comprises a substrate and a light-sensitive layer provided thereon. The light-sensitive layer is not particularly limited, but preferably a light-sensitive layer of photopolymerizable type capable of producing images in a negative-working mode through laser irradiation.

The light-sensitive layer of photopolymerizable type preferably comprises mainly the following components:
(a) a compound having at least one addition-polymerizable ethylenically unsaturated double bond,
(b) a polymer that is soluble or swellable in an aqueous alkaline solution, and
(c) a photopolymerization initiator system.

The above-mentioned light-sensitive layer may further comprise a variety of compounds serving as, for example, a coloring agent, a plasticizer, and a thermal polymerization inhibitor if necessary.

The component (a), that is, a compound having at least one addition-polymerizable ethylenically unsaturated double bond can be selected freely from the group consisting of compounds having at least one, preferably two or more terminal ethylenically unsaturated bonds.

The component (a) may be in any form such as a monomer, a prepolymer including a dimmer, trimer and oligomer, or a mixture and copolymer thereof.

Examples of the aforementioned monomers and copolymers thereof include esters of unsaturated carboxylic acids such as acrylic acid, methacrylic acid, itaconic acid, crotonic acid, isocrotonic acid, and maleic acid with aliphatic polyhydric alcohol compounds and amides of aliphatic polyvalent amine compounds with unsaturated carboxylic acids.

Specific examples of the esters prepared from the unsaturated carboxylic acids and the aliphatic polyhydric alcohol compounds include:

acrylates such as ethylene glycol diacrylate, trimethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol pentaacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate, and polyester acrylate oligomers;

methacrylates such as tetramethylene glycol dimethacrylate, trimethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, dipentaerythritol pentamethacrylate, sorbitol trimethacrylate, sorbitol tetramethacrylate, bis[p-(3-methacryloxy-2-hydroxypropoxy)phenyl]dimethylmethane, and bis[p-(methacryloxyethoxy)phenyl]dimethylmethane;

itaconates such as ethylene glycol diitaconate, propylene glycol diitaconate, 1,3-butanediol diitaconate, 1,4-butanediol diitaconate, tetramethylene glycol diitaconate, pentaerythritol diitaconate, and sorbitol tetraitaconate;

crotonates such as ethylene glycol dicrotonate, tetramethylene glycol dicrotonate, pentaerythritol dicrotonate, and sorbitol tetradicrotonate;

isocrotonates such as ethylene glycol diisocrotonate, pentaerythritol diisocrotonate, and sorbitol tetraisocrotonate;

maleates such as ethylene glycol dimaleate, triethylene glycol dimaleate, pentaerythritol dimaleate, and sorbitol tetramaleate; and mixtures of the above-mentioned ester monomers.

Specific examples of the amide monomers prepared from the aliphatic polyvalent amine compounds and the unsaturated carboxylic acids include methylenebis-acrylamide, methylenebis-methacrylamide, 1,6-hexamethylenebis-acrylamide, 1,6-hexamethylenebis-methacrylamide, diethylenetriamine trisacrylamide, xylylenebis-acrylamide, and xylylenebis-methacrylamide.

Examples of the component (a) further include vinyl urethane compounds, each having at least two polymerizable vinyl groups in the molecule thereof, obtained by adding a vinyl monomer having a hydroxyl group represented by the following general formula (A) to a polyisocyanate compound having at least two isocyanate groups in the molecule thereof as disclosed in Japanese Patent Publication for Opposition Purpose (hereunder referred to as "J.P. KOKOKU) No. Sho 48-41708:

$$CH_2=C(R_3)COOCH_2CH(R_4)OH \quad (A)$$

wherein $R_3$ and $R_4$ are each independently H or $CH_3$.

Furthermore, other examples of the component (a) for use in the present invention are urethane acrylates as disclosed in J.P. KOKAI No. Sho 51-37193 and J.P. KOKOKU No. Hei 2-32293; polyester acrylates as disclosed in J.P. KOKAI No. Sho 48-64183 and J.P. KOKOKU Nos. Sho 49-43191 and Sho 52-30490; polyfunctional (meth)acrylates such as epoxy acrylates obtained through reactions of epoxy resins with (meth)acrylic acid; and photo-curable monomers and oligomers disclosed in Journal of Japan Adhesion Society, 1984, Vol. 20, No. 7, pp.300–308.

The amount of the component (a) suitably ranges from 5 to 70% by weight (hereinafter simply referred to as "%"), preferably 10 to 50% based on the total weight of the overall components.

The component (b) for use in the light-sensitive layer of the PS plate is a polymer soluble or swellable in an aqueous alkaline solution as mentioned above. The polymer works as a film-forming agent for the light-sensitive layer, and may appropriately be selected in consideration of the application of the aqueous alkaline developer. For example, use of a water-soluble organic polymer makes it possible to develop the light-sensitive layer with water.

Examples of such organic polymers include addition polymers having a carboxyl group in the side chain thereof, such as (meth)acrylic acid copolymers, itaconic acid copolymers, crotonic acid copolymers, maleic acid copolymers, and partially esterified maleic acid copolymers as disclosed in J.P. KOKAI Nos. Sho 59-44615, Sho 54-92723, Sho 59-53836 and Sho 59-71048, and J.P. KOKOKU Nos. Sho 54-34327, Sho 58-12577 and Sho 54-25957; and acidic cellulose derivatives having a carboxyl group in the side chain thereof. In addition to the above, polymers obtained by adding a cyclic acid anhydride to an addition polymer having hydroxyl group can also be used. Among the polymers which are preferable as the component (b) are copolymers of benzyl (meth)acrylate, (meth)acrylic acid and other optional addition-polymerizable vinyl monomers and copolymers of allyl (meth)acrylate, (meth)acrylic acid and other optional addition-polymerizable vinyl monomers. Further, polyvinyl pyrrolidone and polyethylene oxide are useful as the water-soluble organic polymers. Alcohol-soluble polyamides and polyethers of 2,2-bis-(4-hydroxyphenyl)-propane with epichlorohydrin are also useful as the component (b) for increasing the strength of the cured film.

Furthermore, polyurethane resins as disclosed in J.P. KOKOKU Nos. Hei 7-120040, Hei 7-120041, Hei 7-120042 and Hei 8-12424, and J.P. KOKAI Nos. Sho 63-287944, Sho 63-287947, Hei 1-271741 and Hei 11-352691 are also useful as the component (b).

The strength of the cured film of the light-sensitive layer can be improved by introducing a radical reactive group into the side chain of the above-mentioned polymer. Examples of the functional groups that can readily cause addition-polymerization reaction are ethylenically unsaturated bond group, amino group, and epoxy group; examples of the functional groups that can be formed into radicals by light exposure are mercapto group, thiol group, halogen atoms, triazine structure, and onium salt structure; and examples of polar groups are carboxyl group and imide group. The ethylenically unsaturated bond groups such as acryl group, methacryl group, allyl group and styryl group are particularly preferable as the functional groups that can readily cause addition-polymerization reaction, and in addition, other functional groups selected from the group consisting of amino group, hydroxyl group, phosphonic acid group, phosphoric acid group, carbamoyl group, isocyanate group, ureido group, ureylene group, sulfonic acid group, and ammonio group are also useful.

It is preferable that the above-mentioned polymer serving as the component (b) be controlled to have an appropriate molecular weight and acid value in order to maintain the development peliormance of a photopolymerizable composition comprising the components (a), (b) and (c). In consideration of development using the developer of the present invention, it is preferable to use any of the above-mentioned polymers with a weight-average molecular weight of from 5,000 to 300,000, and an acid value of 0.2 to 5.0 meq/g.

Such an organic polymer can be incorporated into the photopolymerizable composition in any suitable amounts. However, if the amount of the organic polymer exceeds 90%, undesirable problems will arise, for instance, the strength of images formed by development may be insufficient. In light of this, the amount of the organic polymer is preferably in the range of from 10 to 90%, more preferably from 30 to 80%. It is preferable that the weight ratio of the photopolymerizable ethylenically unsaturated compound (component (a)) to the organic polymer (component (b)) be in the range of 1:9 to 9:1, more preferably 2:8 to 8:2, and further preferably 3:7 to 7:3.

The component (c) for use in the light-sensitive layer of the PS plate is a photopolymerization initiator. Depending upon the wavelength of light emitting from the employed light source, the photopolymerization initiator may appropriately be selected from a variety of photopolymerization initiators well known in patents and references. Further, two or more polymerization initiators may be used in combination to prepare a combined initiator system.

Some combined initiator systems are proposed to cope with the light sources of visible light with a wavelength of 400 nm or more, Ar laser, second harmonic wave of semiconductor laser, and SHG-YAG laser. For instance, U.S. Pat. No. 2,850,445 discloses certain dyes capable of causing photoreduction such as Rose Bengal, Eosine, and Erythrosine. Moreover, combined initiator systems using a dye and an initiator are as follows: a composite initiator system of a dye and an amine (J.P. KOKOKU No. Sho 44-20189); a combined system of hexaarylbiimidazole, a radical generator and a dye (J.P. KOKOKU No. Sho 45-37377); a system of hexaarylbiimidazole and p-dialkylaminobenzylidene ketone (J.P. KOKOKU No. Sho 47-2528 and J.P. KOKAI No. Sho 54-155292); a system comprising a cyclic cis-α-dicarbonyl compound and a dye (J.P. KOKAI No. Sho 48-84183); a system comprising a cyclic triazine and a merocyanine dye (J.P. KOKAI No. Sho 54-151024); a system comprising a 3-ketocoumarin compound and an activator (J.P. KOKAI Nos. Sho 52-112681 and Sho 58-15503); a system comprising biimidazole, a styrene derivative, and a thiol (J.P. KOKAI No. Sho 59-140203); a system comprising an organic peroxide and a dye (J.P. KOKAI Nos. Sho 59-1504, Sho 59-140203, Sho 59-189340 and Sho 62-174203, J.P. KOKOKU No. Sho 62-1641, and U.S. Pat. No. 4,766,055); a system comprising a dye and an active halogen compound (J.P. KOKAI Nos. Sho 63-258903 and Hei 2-63054); a system comprising a dye and a borate compound (J.P. KOKAI Nos. Sho 62-143044, Sho 62-150242, Sho 64-13140, Sho 64-13141, Sho 64-13142, Sho 64-13143, Sho 64-13144, Sho 64-17048, Hei 1-229003, Hei 1-298348 and Hei 1-10 138204); a system comprising a dye with a rhodanine ring and a radical generator (J.P. KOKAI Nos. Hei 2-179643 and Hei 2-244050); a system comprising titanocene and a 3-ketocoumarin dye (J.P. KOKAI No. Sho 63-221110); a system comprising titanocene, a xanthene dye and an addition-polymerizable ethylenically unsaturated compound having amino group or urethane group (J.P. KOKAI Nos. Hei 4-221958 and Hei 4-219756); a system comprising titanocene and a particular merocyanine dye (J.P. KOKAI No. Hei 6-295061); and a system comprising titanocene, a dye having benzopyran ring (J.P. KOKA No. Hei 8-334897) and the like.

Of the above-mentioned initiator systems, the systems using titanocene compounds are particularly preferred because of excellent sensitivity. The titanocene compounds may appropriately be selected, for example, from a variety of titanocene compounds as disclosed in J.P. KOKAI Nos. Sho 59-152396 and Sho 61-151197.

Specific examples of such titanocene compounds are as follows: di-cyclopentadienyl-Ti-di-chloride, di-cyclopentadienyl-Ti-bis-phenyl, di-cyclopentadienyl-Ti-bis-2,3,4,5,6-pentafluorophen-1-yl, di-cyclopentadienyl-Ti-bis-2,3,5,6-tetrafluorophen-1-yl, di-cyclopentadienyl-Ti-bis-2,4,6-trifluorophen-1-yl, di-cyclopentadienyl-Ti-bis-2,6-di-fluorophen-1-yl, di-cyclopentadienyl-Ti-bis-2,4-difluorophen-1-yl, di-methylcyclopentadienyl-Ti-bis-2,3,4,5,6-tetrafluorophen-1-yl, di-methylcyclopentadienyl-Ti-bis-2,6-difluorophen-1-yl, and di-cyclopentadienyl-Ti-bis-2,6-difluoro-3-(pyrro-1-yl)-phen-1-yl.

Furthermore, some assistants such as an amine compound and a thiol compound may be added to the photopolymerization initiator when necessary. The addition of such hydrogen-donating compounds can enhance the performance of the employed photopolymerization initiator.

The amount of the photopolymerization initiator is suitably in the range of 0.05 to 100 parts by weight, preferably 0.1 to 70 parts by weight, and more preferably 0.2 to 50 parts by weight, with respect to 100 parts by weight of the ethylenically unsaturated compound.

In addition to the foregoing fundamental components (a), (b) and (c), a small amount of thermal polymerization inhibitor is desirably contained in the photopolymerizable composition to inhibit undesired thermal polymerization of the photopolymerizable ethylenically unsaturated compound during preparation or storage of the photopolymerizable composition. Examples of such thermal polymerization inhibitors include hydroquinone, p-methoxyphenol, di-t-butyl-p-cresol, pyrogallol, t-butyl catechol, benzoquinone, 4,4'-thiobis(3-methyl-6-t-butylphenol), 2,2'-methylenebis(4-methyl-6-t-butylphenol), N-nitrosophenyl hydroxylamine cerium salt and N-nitrosophenyl hydroxylamine aluminum salt. The amount of the thermal polymerization inhibitor is preferably from about 0.01 to about 5% based on the total weight of the photopolymerizable composition. In addition, the photopolymerizable composition may optionally comprise, for example, higher fatty acid derivatives such as behenic acid and behenic acid amide when necessary. To effectively eliminate the polymerization inhibitory effect of oxygen, such higher fatty acid derivatives may be localized in the surface portion of the light-sensitive layer at the drying step for the formation of the light-sensitive layer. The amount of the higher fatty acid derivatives is preferably from about 0.5 to about 10% based on the total weight of the photopolymerizable composition.

Furthermore, the composition may further comprise a coloring agent for pigmenting the resulting light-sensitive layer. Examples of the coloring agent include pigments such as phthalocyanine pigments (C.I. Pigment Blue 15:3, 15:4, 15:6 and the like), azo pigments, carbon black, and titanium oxide; and dyes such as Ethyl Violet, Crystal Violet, azo dyes, anthraquinone dyes and cyanine dyes. The amount of the coloring agent including such pigments and dyes is preferably from about 0.5 to about 20% based on the total weight of solid content in the obtained light-sensitive layer.

Moreover, the photopolymerizable composition may further comprise inorganic fillers and plasticizers such as dioctyl phthalate, dimethyl phthalate and tricresyl phosphate for improving the physical properties of the resultant cured film. The amount of such additives including the inorganic fillers and plasticizers is preferably 10% or less of the total weight of solid content in the obtained light-sensitive layer.

To provide the light-sensitive layer on a substrate, which will be described later, the photopolymerizable composition is dissolved in various kinds of organic solvents to prepare a coating liquid and then the coating liquid is applied onto the surface of the substrate. Examples of the solvents include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methoxypropanol, methoxymethoxyethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethyl sulfoxide, γ-butyrolactone, methyl lactate, and ethyl lactate. These solvents may be used alone or in combination. The concentration of the solid content in the coating liquid is suitably from 1 to 50% by weight.

To improve the surface quality of the coated surface, the photopolymerizable composition for use in the light-sensitive layer may further comprise a surfactant.

When the coating liquid for the photosensitive layer is applied, the coating amount is preferably from about 0.1 to about 10 $g/m^2$, preferably from 0.3 to 5 $g/m^2$, and more preferably from 0.5 to 3 $g/m^2$ on a dry basis.

The photosensitive layer of the PS plate will now be described in terms of acid value.

The acid value of the light-sensitive layer referred to in the present invention is an amount equivalent to an acid with pKa of 9 or less contained in units per gram of the light-sensitive layer that is provided on the substrate. In the calculation of the acid value, overcoat layers including an oxygen barrier layer, which are provided on the light-sensitive layer are not considered. The acid value of the light-sensitive layer can be experimentally obtained by titration using an aqueous solution of sodium hydroxide, and also by calculation from the total content of compounds having acid groups with pKa of 9 or less in the photopolymerizable composition.

The acid value of the light-sensitive layer can be controlled by changing the amount ratio of the component (a) to the component (b) having acid group, and employing as the component (b) a low-acid value binder polymer containing a smaller amount of acid group. In the latter case, the use of a binder polymer with an acid value of 1.5 meq/g or less, preferably 1.2 meq/g or less is effective.

It is preferable that the light-sensitive layer of the PS plate for use in the present invention has an acid value of 1.0 meq/g or less, more preferably in the range of 0.20 to 0.60 meq/g in light of the application to the lithographic printing plate, and most preferably in the range of 0.30 to 0.50 meq/g in terms of image-forming performance.

The substrate for use in the PS plate will now be explained in detail.

Any dimensionally stable plate-shaped materials can be used as the substrates for the PS plate for use in the present invention. In light of dimensional stability, aluminum substrates are particularly preferred. Aluminum plates substantially composed of aluminum and aluminum-containing alloys, for example, alloys of aluminum with metals such as silicon, copper, manganese, magnesium, chromium, zinc, lead, bismuth and nickel can be used. Alternatively, an aluminum or aluminum alloy sheet may be attached to a sheet of paper or a plastic film to form a laminate sheet, or aluminum or aluminum alloys may be deposited thereon. Further, a composite sheet obtained by attaching an aluminum sheet to a polyethylene terephthalate film as disclosed in J.P. KOKOKU No. Sho 48-18327 is also preferably used as the substrate of the PS plate.

Such aluminum substrates are subjected to various kinds of surface treatment.

One of the surface treatment methods for the aluminum substrates is graining, i.e., mechanical surface-graining, chemical etching, electrolytic graining as disclosed in J.P. KOKAI No. Sho 56-28893. To be more specific, the surface of the aluminum substrate may be electrochemically grained in an electrolytic solution comprising hydrochloric acid or nitric acid. Alternatively, the aluminum surface may be subjected to mechanical graining such as wire brush graining by rubbing the aluminum surface with metal wire; ball graining using the combination of abrasive ball and abrasive material; and brush graining using nylon brush and abrasive agent. Such surface-graining methods may be used alone or in combination.

Of the above-mentioned methods for roughening the aluminum surface to a predetermined extent, the electrochemical surface-graining in an electrolytic solution of hydrochloric acid or nitric acid is particularly effective in the present invention. In this case, the electrical charge is suitably in the range of from 100 to 400 C/dm$^2$. More specifically, the aluminum substrate may be placed in an electrolytic solution containing 0.1 to 50% of hydrochloric acid or nitric acid and electrolysis may be carried out at a temperature of from 20 to 100° C. for one second to 30 minutes with the electrical charge controlled to 100 to 400 C/dm$^2$.

The aluminum substrate grained in the above-mentioned manner may be subjected to chemical etching with acids or alkalis. The use of alkalis for an etchant is advantageous for industrial applications because the time required to destroy the fine structure can be curtailed. Preferable examples of the alkalis for use in etching are sodium hydroxide, sodium carbonate, sodium aluminate, sodium metasilicate, sodium phosphate, potassium hydroxide and lithium hydroxide. It is preferable to control the concentration of the alkali in the etchant to 1 to 50% and the temperature of the etchant to 20 to 100° C. so that the amount of aluminum to be dissolved in the etchant is in the range of from 5 to 20 g/m$^3$.

The etched aluminum surface may be then subjected to pickling for removing smut remaining on the etched surface. For pickling, nitric acid, sulfuric acid, phosphoric acid, chromic acid, hydrofluoric acid, fluoroboric acid are preferably employed. In particular, after the electrochemical surface-graining, to bring the etched aluminum surface into contact with a 15–65 wt% sulfuric acid solution at a temperature of from 50 to 90° C. as disclosed in J.P. KOKAI No. Sho 53-12739 is one of the preferable methods for removal of the smut after etching. The alkali etching method as described in J.P. KOKOKU No. Sho 48-28123 is also desirable.

Consequently, the Al substrate for use in the present invention is suitably finished to have a surface roughness of 0.3 to 0.7 g m in terms of (Ra).

Further, it is preferable that the aluminum surface thus treated be subjected to anodization. The anodization may be conducted in accordance with the methods well known in this field. More specifically, a direct current or alternating current is applied to the aluminum substrate in an aqueous solution or nonaqueous solution of hydrochloric acid, sulfuric acid, phosphoric acid, nitric acid, chromic acid, boric acid, oxalic acid, sulfamic acid, benzenesulfonic acid, or mixtures thereof, so that an anodized layer is deposited on the surface of the aluminum substrate.

The anodizing conditions cannot be definitely determined because the conditions vary depending upon the electrolytic solution to be employed. It is generally proper that the concentration of the electrolytic solution ranges from 1 to 80%, the liquid temperature ranges from 5 to 70° C., the current density be controlled to 0.5 to 60 A/dm$^2$, the applied voltage be in the range of 1 to 100 V, and the time for electrolysis be 10 to 100 sec.

One of the preferable anodizing methods is described in British Patent No. 1,412,768 where anodization is conducted in sulfuric acid at high current density, and the other method is to use an electrolytic bath of phosphoric acid as disclosed in U.S. Pat. No. 3,511,661.

In the present invention, it is preferable that the anodized layer deposited on the aluminum substrate by anodization has a thickness of 1 to 10 g/m$^2$, more preferably 1.5 to 7 g/m$^2$, and further preferably 2 to 5 g/m$^2$. When the thickness of the above-mentioned anodized layer is less than 1 g/m$^2$, the resultant PS plate may be susceptible to scratches, while extremely large amount of electric power is required to produce the anodized layer with a thickness of more than 10 g/m$^2$.

Furthermore, after surface-graining and anodization, the aluminum substrate may be subjected to sealing. For sealing, the aluminum substrate is immersed into hot water or a hot aqueous solution of an inorganic or organic salt, or placed in a steam bath. The aluminum surface may be subjected to still another surface treatment such as silicate treatment using silicates of alkali metals, or immersion in an aqueous solution of potassium fluorozirconate or phosphate.

In addition to the above-mentioned aluminum substrates, other plate-shaped materials with dimensional stability can also be used as the substrates for the PS plate. Examples of such dimensionally stable plate-shaped materials include paper, laminate sheets of paper with plastics such as polyethylene, polypropylene and polystyrene, metal plates such as zinc and copper plates, plastic films such as cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate and polyvinyl acetal films, and a sheet of paper or a plastic film to which the above-mentioned metal plates such as zinc and copper plates are attached or on which those metals are deposited.

Such substrates are preferably subjected to surface treatment to make the surface hydrophilic according to the nature of each substrate. The surface can be made hydrophilic by treatments based on some chemical reactions, such as etching, oxidation, reduction, and sol-gel coating. Alternatively, particular compounds capable of being adsorbed by the surface of the substrate may be coated thereon. In the latter case, for example, organic compounds carrying a phosphorus atom-containing acidic groups, e.g, phosphoric acid, phosphonic acid and phosphinic acid, or organic silicone compounds effectively contained in an adhesive layer provided on the aluminum substrate as described in J.P. KOKAI No. 2001-109139 are preferably used for the anodized aluminum substrates.

The PS plate for use in the present invention can be produced by providing the light-sensitive layer on the substrate.

The PS plate may further comprise an organic or inorganic undercoating layer that is interposed between the substrate and the photosensitive layer.

Furthermore, the PS plate for use in the present invention may further comprise a protective layer such as an oxygen barrier layer comprising a water-soluble vinyl polymer as the main component that is overlaid on the light-sensitive layer.

Examples of the water-soluble vinyl polymers for use in the oxygen barrier protection layer include a polyvinyl alcohol which may be partially substituted with ester, ether and acetal; and a copolymer comprising such a partially substituted vinyl alcohol unit and an unsubstituted vinyl alcohol unit in such a substantial amount that can impart the required water-solubility to the resultant copolymer. In the protection layer, polyvinyl alcohols hydrolyzed to the extent of 71 to 100% and have a degree of polymerization of 300 to 2400 are preferably used. Specific examples of the commercially available polyvinyl alcohol products are PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-220, PVA-224, PVA-217EE, PVA-217E, PVA-220E, PVA-224E, PVA-405, PVA-420, PVA-613, and L-8, which are made by KURARAY Co., Ltd. Examples of the above-mentioned copolymers preferably used in the oxygen barrier protection layer include polyvinyl acetate chloroacetate or propionate, polyvinyl formal, polyvinyl acetal and copolymer thereof, which are preferably hydrolyzed to the extent of 88 to 100%. In addition to the above, polyvinyl pyrrolidone, gelatin, and gum arabic are also effectively used for the oxygen barrier protection layer. These polymers may be used alone or in combination.

When the oxygen barrier protection layer is provided by coating, purified water is preferably used alone as a solvent, or in combination with alcohols such as methanol and ethanol, and ketones such as acetone and methyl ethyl ketone. It is proper that the solid content in the coating liquid for formation of the oxygen barrier protection layer be in the range of 1 to 20% by weight.

The oxygen barrier protection layer may further comprise well known additives such as a surfactant for improving the coating characteristics and a water-soluble plasticizer for enhancing the physical properties of the obtained layer.

Examples of the above-mentioned water-soluble plasticizer include propionamide, cyclohexanediol, glycerin, and sorbitol. Water-soluble (meth)acrylic polymers may be added.

The coating amount for the oxygen barrier protection layer is suitably in the range of about 0.1 to about 15 $g/m^2$, preferably in the range of about 1.0 to about 5.0 $g/m^2$ on a dry basis.

The PS plate thus produced undergoes light exposure and development, thereby obtaining a lithographic printing plate. The process for making the lithographic printing plate will now be explained.

The PS plate may be entirely heated, if required, prior to light exposure, during light exposure, or from the initiation of light exposure to termination of development. To heat the PS plate as mentioned above can accelerate the reaction for image formation in the light-sensitive layer, thereby improving the sensitivity and the printing durability and also stabilizing the sensitivity. In this case, the PS plate may be heated under moderate conditions, more specifically, at 150° C. or less. When the PS plate is heated to extremely high temperatures, there will occur some problems, for example, fogging of non-image areas. After termination of the development, it is also effective to subject the images obtained by development to entire heating or entire light exposure for improving the strength of obtained images and the printing durability. In this case, the obtained images may be heated to high temperatures, generally in the range of 200 to 500° C. When the temperature is set within the above-mentioned range, the heating after development has an effect on strength of images without deterioration of the substrate and thermal decomposition of image areas.

Any light exposure methods well known in this field can be used in the present invention. Preferably used are light sources for laser beams. For example, the light sources for laser beams having wavelengths in the range of 350 to 450 nm are as follows:

gas laser such as $Ar^+$ laser (364 nm, 351 nm, 10 mW~1 W), $Kr^+$ laser (356 nm, 351 nm, 10mW–1W), and He—$Cd^+$ laser (441 nm, 325 nm, 1 mW–100 mW);

solid state laser such as combination of Nd:YAG (YVO4) and SHG (355 nm, 5 mW-1 W) and combination of Cr:LiSAF and SHG (430 nm, 10 mW);

semiconductor laser such as $KNbO_3$, ring resonator (430 nm, 30 mW), combination of waveguide optical wavelength conversion device, AlGaAs semiconductor and InGaAs semiconductor (380–450 nm, 5–100 mW), combination of waveguide optical wavelength conversion device, AlGaInP semiconductor and AlGaAs semiconductor (300–350 nm, 5–100 mW), and AlGaInN (350–450 nm, 5–30 mW); and pulse laser such as $N_2$ laser (337 nm, pulse: 0.1–10 mJ), and XeF (351 nm, pulse: 10–250 mJ).

In particular, AlGaInN semiconductor laser beams (commercially available as InGaN-based semiconductor laser beams with wavelengths of 400–410 nm and 5–30 mW) are preferable in terms of wavelength characteristics and cost.

As the light sources for laser beams having wavelengths of 450 to 700 nm, $Ar^+$ laser (488 nm), YAG-SHG laser (532 nm), He-Ne laser (633 nm), He-Cd laser, and red-color semiconductor laser (650–690 nm) are available.

As the light sources for laser beams having wavelengths of 700 to 1200 nm, semiconductor laser (800–850 nm) and Nd-YAG laser (1064 nm) are preferably used.

In addition to the above, there can also be employed a variety of light sources such as ultrahigh pressure, high pressure, intermediate pressure and low pressure mercury lamps, chemical lamps, carbon arc lamps, xenon lamps, metal halide lamps, and ultraviolet laser lamps (ArF excimer laser, KrF excimer laser and the like). Further, radial rays such as electron beams, X-rays, ion beams and far infrared rays can also be used. In consideration of cost, the above-mentioned light sources for laser beams with wavelengths of 350 nm or more are particularly preferable.

Any light exposure mechanism, for example, internal drum exposure method, external drum exposure method, or flat bed method is applicable to the present invention.

The components constituting the light-sensitive layer of the PS plate can be made soluble in neutral water or weak alkaline aqueous solutions when those components have high water-solubility. This type of PS plate can be mounted on a printing machine for achieving the light exposure and development successively to make a lithographic printing plate.

After completion of development, the printing plate may be subjected to various kinds of after-treatment using rinsing water, surfactant-containing rinsings, and liquids for desensitization containing gum arabic and starch derivatives as disclosed in J.P. KOKAI Nos. Sho 54-8002, Sho 55-115045 and Sho 59-58431. Such methods for after-treatment may be employed in combination in the present invention.

The lithographic printing plate thus obtained is set in an offset press to produce a large number of printed materials.

The present invention will be explained in more detail with reference to the following non-limitative working Examples and the effects practically attained by the present invention will also be discussed in detail in comparison with Comparative Examples.

EXAMPLES 1 TO 52 AND COMPARATIVE EXAMPLES 1 TO 5

Production of PS Plates

[Preparation of Substrate No. 1]

An aluminum plate (grade 1S) having a thickness of 0.30 mm was surface-grained with a nylon brush (No. 8) and an aqueous suspension of 800-mesh pumice stone and then sufficiently washed with water. Then the aluminum plate was etched by immersing in a 10% aqueous solution of sodium hydroxide at 70° C. for 60 seconds, followed by successively washing with running water, a 20% nitric acid solution for neutralization, and water. The surface of the aluminum plate was then electrolytically roughened in a 1% aqueous solution of nitric acid by the application of an alternating current in the form of a sinusoidal wave at the applied voltage (Ma) of 12.7 V The electrical charge was set to 300 C/dm$^2$ at the anode side. At this stage, the surface roughness of the aluminum plate was measured and found to be 0.45 µm in terms of Ra unit. Subsequently, the aluminum plate was immersed in a 30% aqueous solution of sulfuric acid at 55° C. for 2 minutes to desmut from the plate. The aluminum plate was then anodized in a 20% aqueous solution of sulfuric acid at 33° C. for 50 seconds at a current density of 5 A/dm2, with the surface-grained surface of the aluminum plate serving as a cathode. The result was that the anodized layer with a thickness of 2.7 g/m$^2$ was deposited on the anode. The aluminum plate thus prepared was used as a substrate No. 1.

[Preparation of Substrate No. 2]

A liquid composition for undercoating layer No. 1 with the following formulation was coated on the substrate No. 1 for surface treatment so that the amount of phosphorus (P) in the coated layer was about 0.05 g/m$^2$. The coated layer was dried at 100° C. for one minute, so that a substrate No. 2 was obtained.

<Liquid Composition for Undercoating Layer No. 1>

|  | Parts by Weight |
|---|---|
| Phenylphosphonic acid | 2 |
| Methanol | 800 |
| Water | 50 |

Preparation of Substrate No. 3

A mixture of the following components was stirred.

|  | Parts by Weight |
|---|---|
| "Phosmer PE" (trademark), made by Uni-Chemical Co., Ltd. | 20 |
| Methanol | 130 |
| Water | 20 |
| p-toluenesulfonic acid | 5 |
| tetraethoxysilane | 50 |
| 3-methacryloxy propyl triethoxysilane | 50 |

About five minutes later, an exothermic reaction was found. After the reaction was carried out for 60 minutes, the reaction product was put into another container, and 30,000 parts by weight of methanol were further added to the reaction product. Thus, a liquid composition for undercoating layer No. 2 was prepared.

The liquid composition for undercoating layer No. 2 thus prepared was coated on the substrate No. 1 for surface treatment so that the amount of silicon (Si) in the coated layer was about 0.001 g/m$^2$. The coated layer was dried at 100° C. for one minute, so that a substrate No. 3 was obtained.

[Formation of Light-sensitive Layer]

The following components were mixed to prepare a coating liquid for formation of a light-sensitive layer.

<Formulation for Coating Liquid for Light-sensitive Layer>

|  | Parts by Weight |
|---|---|
| Ethylenically-unsaturated bond containing compound (A) | a (*) |
| Linear organic polymer (B) | b (*) |
| Sensitizer (C) | 0.15 |
| Photopolymerization initiator (D) | 0.30 |
| Additive (S) | 0.50 |
| Fluorine-containing surfactant ("Megafac F-177" (trademark), made by Dainippon Ink & Chemicals, Incorporated) | 0.03 |
| Thermal polymerization inhibitor (N-nitrosohydroxyl-amine aluminum salt) | 0.01 |
| ε-type copper phthalocyanine dispersion | 0.2 |
| Methyl ethyl ketone | 30.0 |
| Propylene glycol monomethyl ether | 30.0 |

(*) The amounts (a) and (b) are shown in Table 1.

Specific examples of the above-mentioned ethylenically-unsaturated bond containing compound (A), linear organic polymer (B), sensitizer (C), photopolymerization initiator (D), and additive (S) used are shown below:

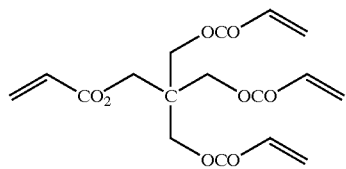
(A-1)
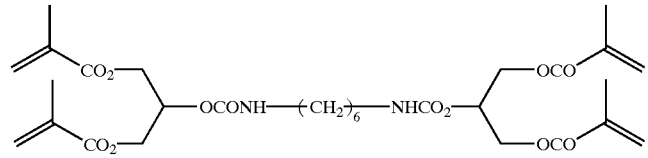
(A-2)
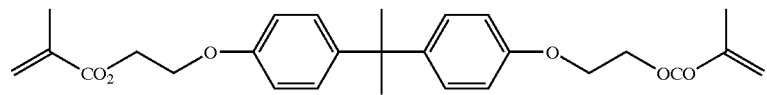
(A-3)
(50 wt %)
Mixture
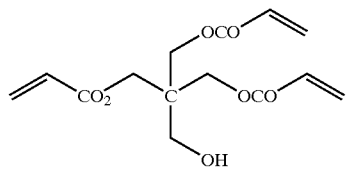
(A-4)
(50 wt %)
Mixture
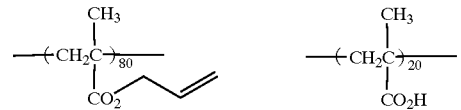
(B-1)
Mw5000
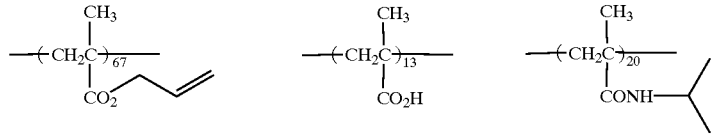
(B-2)
Mw15000
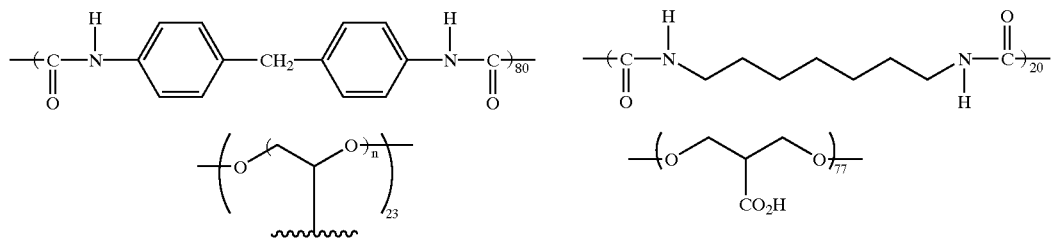
(B-3)
PPG1000
Mw60000

-continued
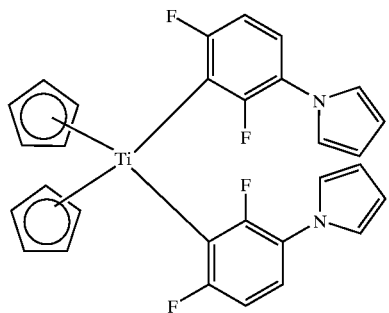 (C-1)
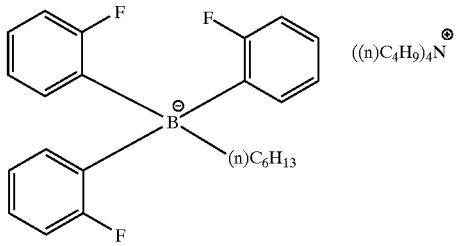 (C-2)
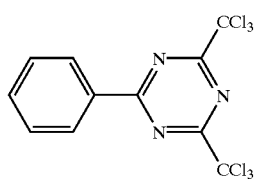 (C-3)
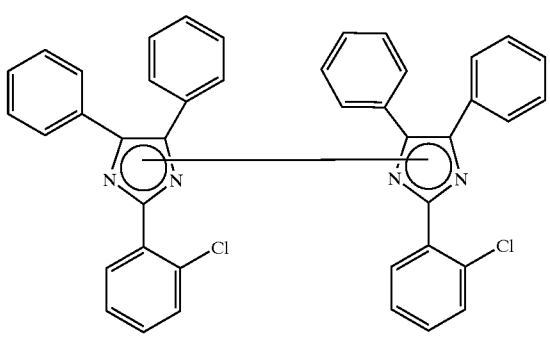 (C-4)
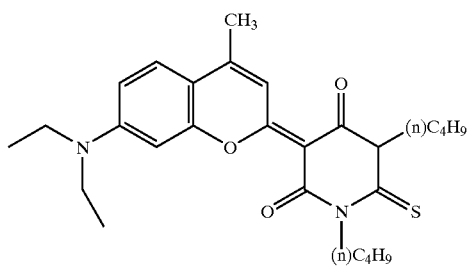 (D-1)
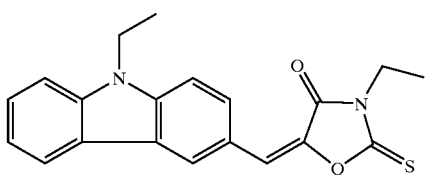 (D-2)
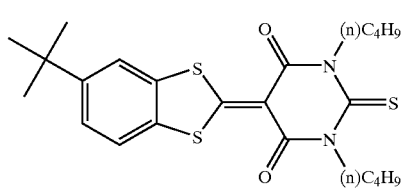 (D-3)
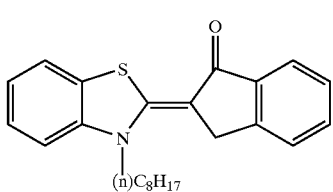 (D-4)
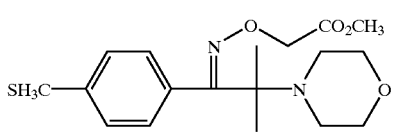 (S-1)
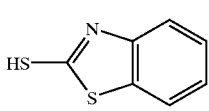 (S-2)

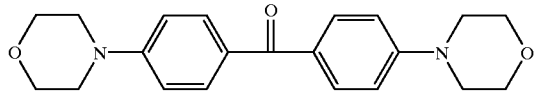

(S-3)

Table 1 shows the combination of the ethylenically-unsaturated bond containing compound (A), linear organic polymer (B), sensitizer (C), photopolymerization initiator (D), and additive (S).

Each coating liquid for the light-sensitive layer was coated on the substrate designated in Table 1 so that the coating amount was 1.5 g/m² on a dry basis and dried at 100° C. for one minute, whereby a light-sensitive layer was provided on the substrate.

Subsequently, a 3% aqueous solution of polyvinyl alcohol with a degree of saponification of 98 mol% and a degree of polymerization of 500 was coated on the photosensitive layer so that the coating amount was 2.5 g/m² on a dry basis and dried at 120° C. for 3 minutes. Thus, PS plates No. 1 to No. 9 were obtained.

TABLE 1

| PS Plate No. | A (a) (parts by weight) | B (b) (parts by weight) | C | D | S | Substrate No. | Acid Value of Light-sensitive Layer (meq/g) (Note) |
|---|---|---|---|---|---|---|---|
| 1 | A-1 (1.7) | B-1 (1.9) | C-1 | D-1 | S-1 | 1 | 0.45 |
| 2 | A-1 (1.7) | B-2 (1.9) | C-1 | D-1 | S-1 | 2 | 0.42 |
| 3 | A-1 (1.5) | B-1 (2.0) | C-1 | D-1 | S-1 | 3 | 0.71 |
| 4 | A-2 (2.3) | B-3 (2.0) | C-1 | D-1 | S-1 | 3 | 0.48 |
| 5 | A-1 (1.7) | B-2 (1.9) | C-1 | D-2 | S-1 | 2 | 0.43 |
| 6 | A-2 (1.7) | B-2 (1.9) | C-2 | D-3 | S-3 | 1 | 0.43 |
| 7 | A-1 (1.7) | B-2 (1.9) | C-3 | D-4 | S-1 | 2 | 0.46 |
| 8 | A-3 (1.7) | B-2 (1.9) | C-4 | D-4 | S-2 | 2 | 0.45 |
| 9 | A-4 (1.7) | B-2 (1.9) | C-1 | D-1 | S-2 | 2 | 0.46 |

(Note)
The amount of acid contained in units per gram of the light-sensitive layer was found by titration with sodium hydroxide, and then, the acid value was determined by calculation from the found value.

Preparation of Developers

Developers No. 1 to No. 35, and Comparative Developer each having the following composition were prepared.

| Alkaline agent | x g (*) |
|---|---|
| Alkali silicate | y g (*) |
| Compound (Y) represented by formula (I) | 5.0 g |
| Chelating agent (Z) | 0.1 g |
| Additive (Q) | 1.0 g |
| Water | (93.9 − (x + y)) g |

(*) The amounts (x) and (y) are shown in Tables 2 to 4.

Specific examples of the above-mentioned chelating agent (Z) and additive (Q) used are shown below:

(Z-1) Tetrasodium ethylenediaminetetraacetate (Z-2) Citric acid (Z-3) Tripotassium hydroxyethylethylenediaminetriacetate

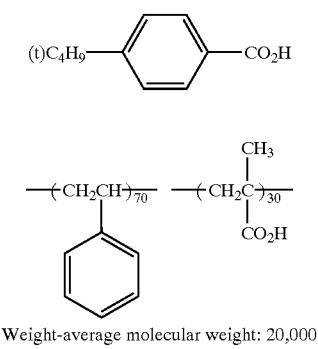

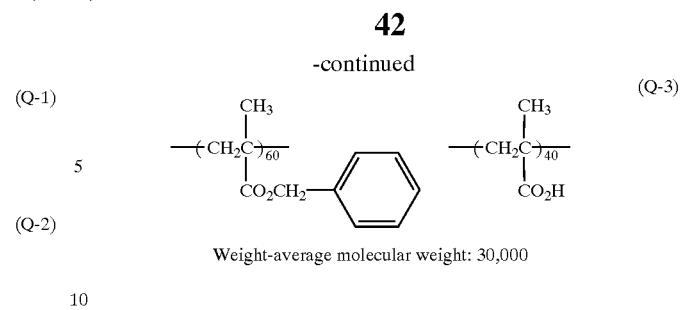

Weight-average molecular weight: 20,000

Weight-average molecular weight: 30,000

Tables 2 to 4 shows the compositions of the developers employed in Examples and Comparative Examples, and the pH values of the resultant developers, and the conductivity thereof which was measured at 25° C. using a commercially available conductivity meter "CM60S" (trademark) made by To a Denpa Kogyo Corporation.

TABLE 2

| Developer No. | Alkaline Agent | x (g) | Alkali Silicate | y (g) | $SiO_2/M_2O$ (Molar Ratio) | Y | Z | Q | pH (25° C.) | Conductivity (mS/cm) |
|---|---|---|---|---|---|---|---|---|---|---|
| No. 1 | NaOH | 0.15 | 1K potassium silicate | 2.4 | 2.0 | Y-1 | Z-1 | — | 12 | 14 |
| No. 2 | KOH | 0 | 1K potassium silicate | 2.4 | 2.0 | Y-1 | Z-1 | — | 11.6 | 6 |
| No. 3 | KOH | 0.2 | 1K potassium silicate | 2.4 | 1.9 | Y-1 | Z-1 | — | 12 | 14 |
| No. 4 | KOH | 0.4 | 1K potassium silicate | 2.4 | 1.8 | Y-1 | Z-1 | — | 12.2 | 15 |
| No. 5 | KOH | 0.8 | 1K potassium silicate | 2.4 | 1.6 | Y-1 | Z-1 | — | 12.5 | 19 |
| No. 6 | KOH | 0.05 | 2K potassium silicate | 1 | 3.4 | Y-1 | Z-1 | — | 11.7 | 7 |
| No. 7 | KOH | 0.05 | A potassium silicate | 3 | 3.0 | Y-1 | Z-1 | — | 11.7 | 7 |
| No. 8 | KOH | 0.05 | Sodium silicate No. 3 | 4 | 3.0 | Y-1 | Z-1 | — | 11.8 | 7 |
| No. 9 | KOH | 0.2 | 1K potassium silicate | 2.4 | 1.9 | Y-1 | — | — | 12 | 14 |
| No. 10 | KOH | 0.2 | 1K potassium silicate | 2.4 | 1.9 | Y-4 | Z-1 | — | 12 | 14 |
| No. 11 | KOH | 0.2 | 1K potassium silicate | 2.4 | 1.9 | Y-6 | Z-1 | — | 12 | 14 |
| No. 12 | KOH | 0.2 | 1K potassium silicate | 2.4 | 1.9 | Y-10 | Z-2 | — | 12 | 14 |
| No. 13 | KOH | 0.2 | 1K potassium silicate | 2.4 | 1.9 | Y-13 | Z-3 | — | 12 | 14 |
| No. 14 | KOH | 0.2 | 1K potassium silicate | 2.4 | 1.9 | Y-17 | Z-1 | — | 12 | 14 |
| No. 15 | KOH | 0.2 | 1K potassium silicate | 2.4 | 1.9 | Y-21 | Z-1 | — | 12 | 14 |
| No. 16 | KOH | 0.2 | 1K potassium silicate | 2.4 | 1.9 | Y-1 | Z-1 | Q-1 | 12 | 14 |
| No. 17 | KOH | 0.2 | 1K potassium silicate | 2.4 | 1.9 | Y-1 | Z-1 | Q-2 | 12 | 14 |
| No. 18 | KOH | 0.2 | 1K potassium silicate | 2.4 | 1.9 | Y-1 | Z-1 | Q-3 | 12 | 14 |
| No. 19 | KOH Monoethanol amine | 0.2 1.35 | 1K potassium silicate | 2.4 | 1.9 | Y-1 | Z-1 | — | 12 | 14 |

TABLE 3

| Developer No. | Alkaline Agent | x (g) | Alkali Silicate | y (g) | $SiO_2/M_2O$ (Molar Ratio) | Y | Z | Q | pH (25° C.) | Conductivity (mS/cm) |
|---|---|---|---|---|---|---|---|---|---|---|
| No. 20 | NaOH $Na_2CO_3$ | 0.15 0.16 | 1K potassium silicate | 2.4 | 2.0 | Y-1 | Z-1 | — | 12 | 16 |
| No. 21 | KOH $K_2CO_3$ | 0 0.16 | 1K potassium silicate | 2.4 | 2.0 | Y-1 | Z-1 | — | 11.6 | 8 |
| No. 22 | KOH $K_2CO_3$ | 0.2 0.16 | 1K potassium silicate | 2.4 | 1.9 | Y-1 | Z-1 | — | 12 | 16 |
| No. 23 | KOH $K_2CO_3$ | 0.4 0.16 | 1K potassium silicate | 2.4 | 1.8 | Y-1 | Z-1 | — | 12.2 | 17 |
| No. 24 | KOH $KHCO_3$ | 0.4 0.16 | 1K potassium silicate | 2.4 | 1.8 | Y-1 | Z-1 | — | 12.2 | 17 |
| No. 25 | KOH $K_2CO_3$ | 0.8 0.16 | 1K potassium silicate | 2.4 | 1.6 | Y-1 | Z-1 | — | 12.5 | 21 |
| No. 26 | KOH $K_2CO_3$ | 0.05 0.16 | 2K potassium silicate | 1 | 3.4 | Y-1 | Z-1 | — | 11.7 | 9 |
| No. 27 | KOH $K_2CO_3$ | 0.05 0.16 | A potassium silicate | 3 | 3.0 | Y-1 | Z-1 | — | 11.7 | 9 |
| No. 28 | KOH $K_2CO_3$ | 0.05 0.16 | Sodium silicate No. 3 | 4 | 3.0 | Y-1 | Z-1 | — | 11.8 | 9 |
| No. 29 | KOH $K_2CO_3$ | 0.2 0.16 | 1K potassium silicate | 2.4 | 1.9 | Y-1 | — | — | 12 | 16 |
| No. 30 | KOH $K_2CO_3$ | 0.2 0.16 | 1K potassium silicate | 2.4 | 1.9 | Y-4 | Z-1 | — | 12 | 16 |

TABLE 4

| Developer No. | Alkaline Agent | x (g) | Alkali Silicate | y (g) | SiO$_2$/M$_2$O (Molar Ratio) | Y | Z | Q | pH (25° C.) | Conductivity (mS/cm) |
|---|---|---|---|---|---|---|---|---|---|---|
| No. 31 | KOH / K$_2$CO$_3$ | 0.2 / 0.16 | 1K potassium silicate | 2.4 | 1.9 | Y-6 | Z-1 | — | 12 | 16 |
| No. 32 | KOH / K$_2$CO$_3$ | 0.2 / 0.16 | 1K potassium silicate | 2.4 | 1.9 | Y-10 | Z-2 | — | 12 | 16 |
| No. 33 | KOH / K$_2$CO$_3$ | 0.2 / 0.16 | 1K potassium silicate | 2.4 | 1.9 | Y-13 | Z-3 | — | 12 | 16 |
| No. 34 | KOH / K$_2$CO$_3$ | 0.2 / 0.16 | 1K potassium silicate | 2.4 | 1.9 | Y-17 | Z-1 | — | 12 | 16 |
| No. 35 | KOH / K$_2$CO$_3$ | 0.2 / 0.16 | 1K potassium silicate | 2.4 | 1.9 | Y-21 | Z-1 | — | 12 | 16 |
| Comparative Developer No. 1 | KOH | 0 | 2K potassium silicate | 1 | 3.5 | Y-1 | Z-1 | — | 10.5 | 5 |
| Comparative Developer No. 2 | KOH | 1.5 | 1K potassium silicate | 2.4 | 1.4 | Y-1 | Z-1 | — | 13 | 35 |
| Comparative Developer No. 3 | KOH | 0.2 | 1K potassium silicate | 1 | 3.5 | — | Z-1 | — | 12 | 14 |
| Comparative Developer No. 4 | A developer "DV-1" available from Fuji Photo Film Co., Ltd. was diluted ten times with water. | | | | | | | | 12.9 | 35 |
| Comparative Developer No. 5 | An organic alkaline developer "DN3C" available from Fuji Photo Film Co., Ltd. was diluted twice with water. | | | | | | | | 10.0 | 8 |

In the above, "1K potassium silicate", "2K potassium silicate", "A potassium silicate" and "sodium silicate No. 3" are trade names of the products manufactured by Nippon Chemical Industrial Co., Ltd. The comparative developers No. 4 and No. 5 don't contain any nonionic compounds represented by formula (I).

In each of Examples 1 to 52 and Comparative Examples 1 to 5, a PS plate selected from Table 1 and a developer from Tables 2 to 4 were employed in combination. The combination of the PS plate and the developer is shown in the following Tables 5 and 6. The PS plates were subjected to light exposure and development under the following conditions to conduct evaluation tests. The evaluation tests were carried out as follows.

(1) Evaluation of Development Performance

Each PS plate was not subjected to light exposure before development. After completion of the development, the color of the obtained printing plate was visually inspected. The color of the light-sensitive layer was recognized when there remained the residue. The results are shown in Tables 5 and 6.

(2) Evaluation of Printing Durability and Scumming After Intermission

Two types of light sources were employed for light exposure of the PS plates. FD-YAG laser ("PlateJet 4" (trademark), made by Cymbolic Sciences, Inc.) with a wavelength of 532 nm and an intensity of 100 mW was used for the PS plates No. 1 to No. 4 and No. 9; and violet LD with a wavelength of 405 nm and an intensity of 30 mW emitting from a laboratory-scale internal drum exposure unit was used for the PS plates No. 5 to No. 8. With an exposure of 100 $\mu$/cm$^2$ under the standard exposure conditions, a solid image and dot images (with an increased dot percent from 1 to 99% by 1%) were subjected to scanning using the above-mentioned light sources at a density of 4000 dpi and 175 rays/inch.

After completion of the light exposure, each PS plate was subjected to development under the standard conditions using a commercially available automatic processor ("LP-850P2" (trade name), made by Fuji Photo Film Co., Ltd.) equipped with the developer as designated in Tables 2 to 4 and a finishing gum ("FP-2W" (trade name), made by Fuji Photo Film Co., Ltd.), whereby a lithographic printing plate was obtained. Each PS plate was pre-heated after light exposure so that the surface temperature of the plate reached 100° C., and the plate was immersed in the developer for 15 seconds.

With the obtained printing plate set on a lithographic press "R201" (trade name), made by MAN Roland, printing operation was carried out using a printing ink ("GEOS G black (N)" (trade name), made by Dainippon Ink & Chemicals, Incorporated). To evaluate the printing durability, occurrence of dot loss on the dot image with a dot percent of 3% was examined. The printing durability was expressed by the maximum number of printed sheets before the occurrence of dot loss. The results are shown in Tables 5 and 6.

Scumming after intermission was examined by the following method. The obtained PS plate was set on a lithographic press "DAIYA IF2" (trade name), made by Mitsubishi Heavy Industries, Ltd., which was equipped with a printing ink ("GEOS G magenta (S)" (trade name), made by Dainippon Ink & Chemicals, Incorporated) to start printing operation. The printing operation was stopped and the press was allowed to stand for one hour with the printing ink being attached to the printing plate. When the press was started again one hour later, the presence of scumming on non-image areas for printed matter was visually checked. The results are shown in Tables 5 and 6.

(3) Evaluation of Sludge in Developer

After completion of the development of the above-mentioned printing plate (20 m$^2$) using the correspondent developer (1 litter), the developer was allowed to stand for one month. The presence of any sludge in the developer was inspected. The results are also shown in Tables 5 and 6.

TABLE 5

| | PS Plate No. | Developer No. | Development Performance (*) | Scumming after Intermission () | Printing Durability (No. of Sheets) | Sludge in Developer (*) |
|---|---|---|---|---|---|---|
| Ex. 1 | 1 | 3 | Nil | Nil | 200,000 | Nil |
| Ex. 2 | 2 | 3 | Nil | Nil | 200,000 | Nil |
| Ex. 3 | 3 | 3 | Nil | Nil | 120,000 | Nil |
| Ex. 4 | 4 | 3 | Nil | Nil | 250,000 | Nil |
| Ex. 5 | 5 | 3 | Nil | Nil | 200,000 | Nil |
| Ex. 6 | 6 | 3 | Nil | Nil | 200,000 | Nil |
| Ex. 7 | 7 | 3 | Nil | Nil | 200,000 | Nil |
| Ex. 8 | 8 | 3 | Nil | Nil | 150,000 | Nil |
| Ex. 9 | 9 | 3 | Nil | Nil | 150,000 | Nil |
| Ex. 10 | 4 | 1 | Nil | Nil | 250,000 | Nil |
| Ex. 11 | 4 | 2 | Nil | Nil | 250,000 | Nil |
| Ex. 12 | 4 | 3 | Nil | Nil | 250,000 | Nil |
| Ex. 13 | 4 | 4 | Nil | Nil | 250,000 | Nil |
| Ex. 14 | 4 | 5 | Nil | Nil | 250,000 | Nil |
| Ex. 15 | 4 | 6 | Nil | Nil | 250,000 | Nil |
| Ex. 16 | 4 | 7 | Nil | Nil | 250,000 | Nil |
| Ex. 17 | 4 | 8 | Nil | Nil | 250,000 | Nil |
| Ex. 18 | 4 | 9 | Nil | Nil | 250,000 | Nil |
| Ex. 19 | 4 | 10 | Nil | Nil | 250,000 | Nil |
| Ex. 20 | 4 | 11 | Nil | Nil | 250,000 | Nil |
| Ex. 21 | 4 | 12 | Nil | Nil | 250,000 | Nil |
| Ex. 22 | 4 | 13 | Nil | Nil | 250,000 | Nil |
| Ex. 23 | 4 | 14 | Nil | Nil | 250,000 | Nil |
| Ex. 24 | 4 | 15 | Nil | Nil | 250,000 | Nil |
| Ex. 25 | 4 | 16 | Nil | Nil | 250,000 | Nil |
| Ex. 26 | 4 | 17 | Nil | Nil | 250,000 | Nil |
| Ex. 27 | 4 | 18 | Nil | Nil | 250,000 | Nil |
| Ex. 28 | 4 | 19 | Nil | Nil | 250,000 | Nil |
| Ex. 29 | 1 | 23 | Nil | Nil | 200,000 | Nil |
| Ex. 30 | 2 | 23 | Nil | Nil | 200,000 | Nil |
| Ex. 31 | 3 | 23 | Nil | Nil | 120,000 | Nil |
| Ex. 32 | 4 | 23 | Nil | Nil | 250,000 | Nil |
| Ex. 33 | 5 | 23 | Nil | Nil | 200,000 | Nil |
| Ex. 34 | 6 | 23 | Nil | Nil | 200,000 | Nil |
| Ex. 35 | 7 | 23 | Nil | Nil | 200,000 | Nil |
| Ex. 36 | 8 | 23 | Nil | Nil | 150,000 | Nil |
| Ex. 37 | 9 | 23 | Nil | Nil | 150,000 | Nil |
| Ex. 38 | 4 | 20 | Nil | Nil | 250,000 | Nil |
| Ex. 39 | 4 | 21 | Nil | Nil | 250,000 | Nil |

TABLE 6

| | PS Plate No. | Developer No. | Development Performance (*) | Scumming after Intermission () | Printing Durability (No. of Sheets) | Sludge in Developer (*) |
|---|---|---|---|---|---|---|
| Ex. 40 | 4 | 22 | Nil | Nil | 250,000 | Nil |
| Ex. 41 | 4 | 24 | Nil | Nil | 250,000 | Nil |
| Ex. 42 | 4 | 25 | Nil | Nil | 250,000 | Nil |
| Ex. 43 | 4 | 26 | Nil | Nil | 250,000 | Nil |
| Ex. 44 | 4 | 27 | Nil | Nil | 250,000 | Nil |
| Ex. 45 | 4 | 28 | Nil | Nil | 250,000 | Nil |
| Ex. 46 | 4 | 29 | Nil | Nil | 250,000 | Nil |
| Ex. 47 | 4 | 30 | Nil | Nil | 250,000 | Nil |
| Ex. 48 | 4 | 31 | Nil | Nil | 250,000 | Nil |
| Ex. 49 | 4 | 32 | Nil | Nil | 250,000 | Nil |
| Ex. 50 | 4 | 33 | Nil | Nil | 250,000 | Nil |
| Ex. 51 | 4 | 34 | Nil | Nil | 250,000 | Nil |
| Ex. 52 | 4 | 35 | Nil | Nil | 250,000 | Nil |
| Comp. Ex. 1 | 4 | Comp. 1 | Observed | Observed | 250,000 | Observed |
| Comp. Ex. 2 | 4 | Comp. 2 | Nil | Nil | 80,000 | Nil |
| Comp. Ex. 3 | 4 | Comp. 3 | Observed | Observed | 250,000 | Observed |
| Comp. Ex. 4 | 4 | Comp. 4 | Nil | Nil | 100,000 | Observed |

TABLE 6-continued

| | PS Plate No. | Developer No. | Development Performance (*) | Scumming after Intermission () | Printing Durability (No. of Sheets) | Sludge in Developer (*) |
|---|---|---|---|---|---|---|
| Comp. Ex. 5 | 4 | Comp. 5 | Observed | Observed | 50,000 | Observed |

(*) "Nil" means there remained no light-sensitive layer, i.e., no residue, while "Observed" means there remained the light-sensitive layer, i.e., residue.
(**) "Nil" means there was no ink contamination on non-image areas for printed matter after the printing operation was started again after intermission; while "observed" means ink contamination was observed on non-image areas.
(***) "Nil" means there was no sludge in the developer; while "observed" means there was sludge in the developer.

As is apparent from Tables 5 and 6, the developers according to the present invention exhibit excellent development performance and impart favorable printing durability to a printing plate, without scumming of the non-image areas even after intermission. Further, the developers of the present invention produce no sludge in the developer over a long period of time, thereby exhibiting stable running performance.

(4) Evaluation of Development Behavior

In accordance with the inspection methods as mentioned above, the development behavior was examined in Example 4 and Comparative Examples 1 to 5. The results are shown in Table 7.

TABLE 7

| | PS Plate No. | Developer No. | Rate of Developing Non-exposed area ($\mu$m/s) | Rate of Developer-Penetration into Exposed area ($\mu$m/s) | Dissolving Behavior (Presence/Absence of Interference wave) |
|---|---|---|---|---|---|
| Ex. 4 | 4 | 3 | 0.2 | 0.005 | Present |
| Comp. Ex. 1 | 4 | Comp. 1 | 0.005 | 0.005 | Absent |
| Comp. Ex. 2 | 4 | Comp. 2 | 0.005 | 0.005 | Absent |
| Comp. Ex. 3 | 4 | Comp. 3 | 0.01 | 0.15 | Absent |
| Comp. Ex. 4 | 4 | Comp. 4 | 0.01 | 0.15 | Absent |
| Comp. Ex. 5 | 4 | Comp. 5 | 0.05 | 0.2 | Absent |

The developers for PS plates and the method for making the printing plate using the above-mentioned developers according to the present invention are advantageous in that scumming during printing can be prevented and the printing durability can be improved without impairing the image formation performance on the PS plates. The compounds not soluble in the developers used hitherto can be dissolved or dispersed stably in the developers of the present invention for a long period of time, so that the running performance of the developer can be excellent and stabilized.

What is claimed is:

1. A method for preparing a lithographic printing plate comprising the steps of imagewise exposing, to light, a presensitized plate for use in making a lithographic printing plate, which comprises a substrate provided thereon with a photopolymerizable light-sensitive layer containing a compound having at least one addition-polymerizable ethylenically unsaturated double bond and a photopolymerization initiator; and then developing the exposed presensitized plate using a developer which is characterized in that it comprises an alkali silicate and a nonionic compound represented by the following general formula (I), it has a molar ratio: $SiO_2/M_2O$ (wherein M represents an alkali metal or an ammonium group) ranging from 0.75 to 4.0, and a pH value ranging from 11.5 to 12.8:

$$A-W \qquad (I)$$

wherein A represents a hydrophobic organic group whose logP as determined for A—H is not less than 1.5 and W represents a nonionic hydrophilic organic group whose logP as determined for W—H is less than 1.0.

2. The method for preparing a lithographic printing plate of claim 1, wherein the light-sensitive layer has an acid value of not more than 1.0 meq/g.

3. The method for preparing a lithographic printing plate of claim 1, wherein the light-sensitive layer comprises a compound having an acid group whose pKa value is not more than 9 and the light-sensitive layer has an acid value ranging from 0.20 to 0.60 meq/g.

4. The method for preparing a lithographic printing plate of claim 1, wherein the imagewise exposed presensitized plate is developed in such a manner that the rate of development of the non-exposed area is not less than 0.05 $\mu$m/s and the rate of the developer penetrating into the exposed area is not more than 0.1 $\mu$m/s.

5. The method for preparing a lithographic printing plate of claim 1, wherein the light-sensitive layer comprises a titanocene type initiator.

6. The method for preparing a lithographic printing plate of claim 1, wherein the light-sensitive layer comprises a coloring agent.

7. The method for preparing a lithographic printing plate of claim 1, wherein the substrate of the light-sensitive lithographic printing plate is an anodized aluminum substrate provided thereon with an organic compound carrying a phosphorus atom-containing acidic group or an organic silicone compound.

8. The method for preparing a lithographic printing plate of claim 1, wherein the alkali silicate is selected from the group consisting of sodium silicate, potassium silicate, lithium silicate and ammonium silicate.

9. The method for preparing a lithographic printing plate of claim 1, wherein the developer has the molar ratio: $SiO_2/M_2O$ of from 1.0 to 3.0.

10. The method for preparing a lithographic printing plate of claim 1, wherein the content of the alkali silicate in the developer ranges from 0.1 to 3% by weight as expressed in terms of the amount of silicon dioxide ($SiO_2$).

11. The method for preparing a lithographic printing plate of claim 1, wherein the content of the nonionic compound in the developer ranges from 0.1 to 15% by weight.

12. The method for preparing a lithographic printing plate of claim 1, wherein the nonionic compound in the developer is at least one member selected from the group consisting of nonionic aromatic ether type surfactants represented by the following general formula (I-A) and nonionic aromatic ether type surfactants represented by the following general formula (I-B):

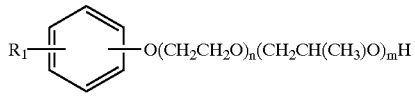
(I-A)

(I-B)

wherein $R_1$ and $R_2$ each represents H or an alkyl group having 1 to 100 carbon atoms and n and m each represents an integer ranging from 0 to 100, provided that n and m are not simultaneously zero.

13. The method for preparing a lithographic printing plate of claim 1, wherein the developer comprises carbonic acid or a carbonate.

14. The method for preparing a lithographic printing plate of claim 1, wherein the developer comprises an alkaline agent selected from the group consisting of sodium hydroxide, potassium hydroxide, lithium hydroxide, sodium tertiary phosphate, potassium tertiary phosphate, ammonium tertiary phosphate, sodium secondary phosphate, potassium secondary phosphate, ammonium secondary phosphate, sodium carbonate, potassium carbonate, ammonium carbonate, sodium bicarbonate, potassium bicarbonate, ammonium bicarbonate, sodium borate, potassium borate and ammonium borate, potassium citrate, sodium citrate, monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, pyridine, tetramethylammonium hydroxide and mixture thereof.

15. The method for preparing a lithographic printing plate of claim 1, wherein the developer comprises a chelating agent for divalent metals.

16. The method for preparing a lithographic printing plate of claim 1, wherein the developer has a conductivity ranging from 3 to 30 mS/cm.

* * * * *